US006452239B1

United States Patent
McDowell et al.

(10) Patent No.: US 6,452,239 B1
(45) Date of Patent: Sep. 17, 2002

(54) HIGH-EFFICIENCY MINIATURE MAGNETIC INTEGRATED CIRCUIT STRUCTURES

(75) Inventors: Joseph McDowell, Los Gatos; James Harris, Saratoga; Juan Monico, San Jose; Otto Voegli, Morgan Hill, all of CA (US)

(73) Assignee: Plumeria Investments, Inc., Los Altos, CA (US)

( * ) Notice: Subject to any disclaimer, the term of this patent is extended or adjusted under 35 U.S.C. 154(b) by 0 days.

(21) Appl. No.: 09/525,453

(22) Filed: Mar. 14, 2000

Related U.S. Application Data

(62) Division of application No. 09/083,272, filed on May 12, 1998, now Pat. No. 6,051,441.

(51) Int. Cl.$^7$ .............................................. H01L 29/82
(52) U.S. Cl. ...................................... 257/421; 257/427
(58) Field of Search ................................ 257/295, 314, 257/315, 421, 422–427; 365/9, 14, 170, 171, 173

(56) References Cited

U.S. PATENT DOCUMENTS 3,609,715 A * 9/1971 Meier
5,107,460 A * 4/1992 Matthews
5,763,928 A * 6/1998 Hennig

* cited by examiner

Primary Examiner—Nathan J. Flynn
Assistant Examiner—Kevin Quinto

(74) Attorney, Agent, or Firm—Robert E. Krebs; Thelen Reid & Priest

(57) ABSTRACT

The present invention, generally speaking, provides a magnetic memory element that is single domain in nature and has a geometry that mitigates the effects of half-select noise. In a preferred embodiment, the magnetic memory element takes the form of a magnetic post or tube having an aspect ratio in the range of 2:1 (more preferably 4:1). The outside diameter of the magnetic tube or post is preferably less than 0.8 microns, more preferably 0.6 microns or less. The magnetic post or tube then functions as a single magnetic domain. In the case of a magnetic tube, the skin of the tube is formed of a magnetic material and the interior of the tube is formed of a non-magnetic material. Suitable non-magnetic materials include copper, gold and silicon. The coercivity of the magnetic tube structure may be adjusted by adjusting the thickness of the magnetic skin. As a result, the magnetic memory element is readily scalable to smaller geometries as lithographic techniques improve. The combination of very small, single-domain size and a relatively large aspect ratio results in uniquely desirable properties. Current levels within any reasonable expectation operate to switch the state of the magnetic tube only when the magnetic tube is destabilized by running current through it. With current flowing through the magnetic tube, its state may be readily changed by running modest currents in opposite directions through two parallel conductors, one on each side of the magnetic tube. When the magnetic tube is switched, the single domain nature of the magnetic tube produces a signal that is typically 10–15 times stronger than signals produced by conventional magnetic memory elements. The magnetic tube functions as a vertical magnetic field generator and may be formed in intimate proximity to a magnetic field sensor such as above the gate of a magFET.

6 Claims, 23 Drawing Sheets

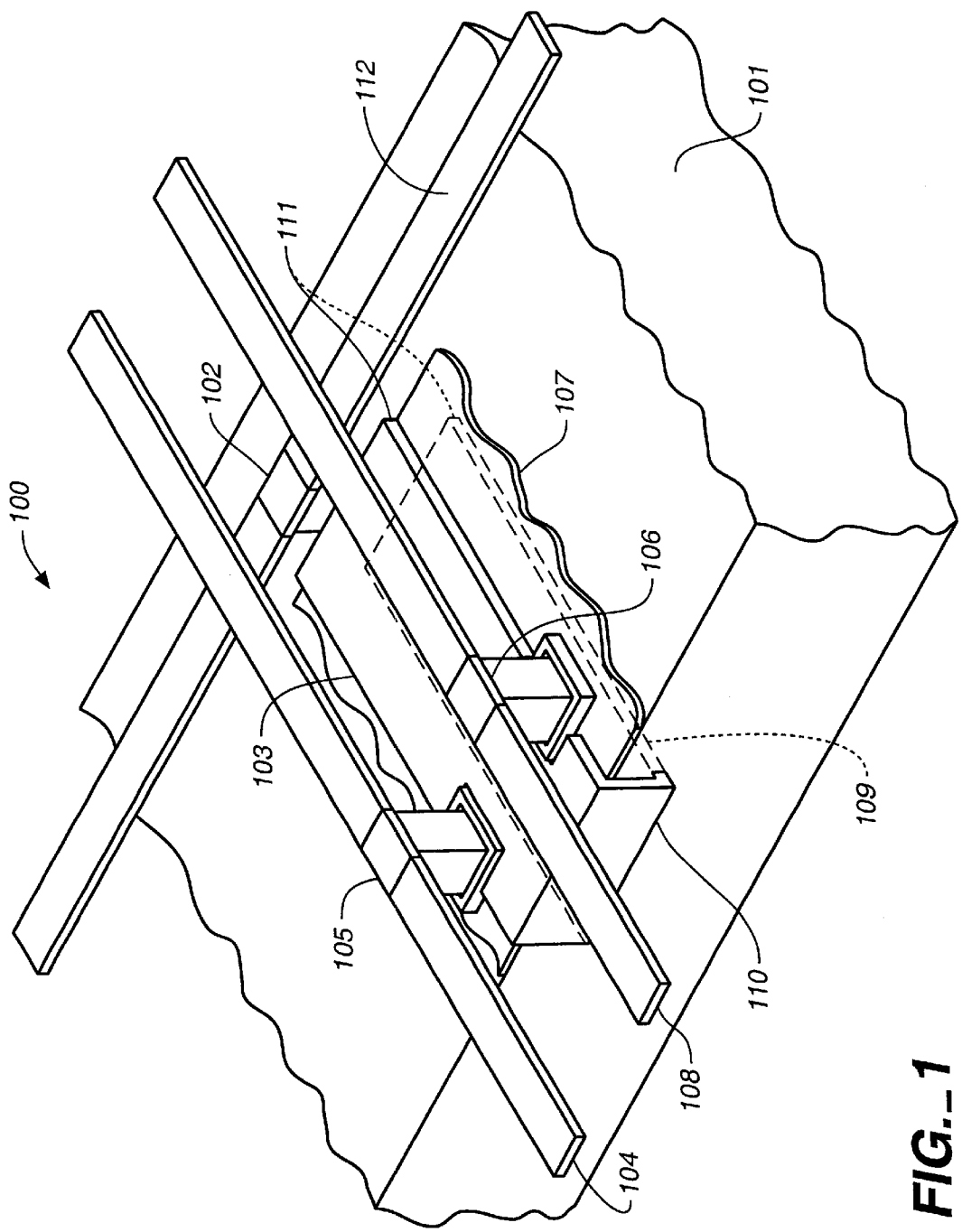
FIG._1

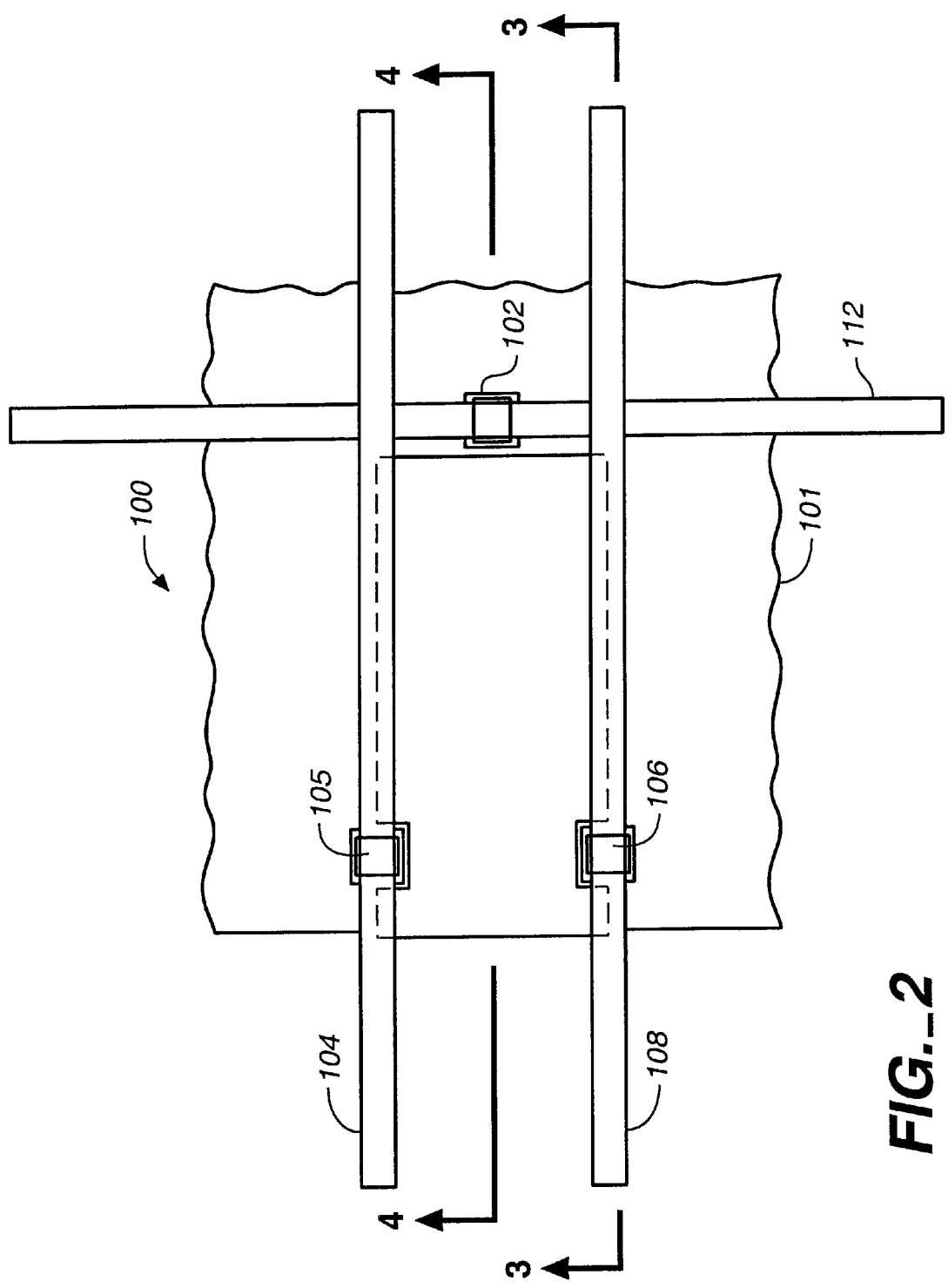
FIG._2

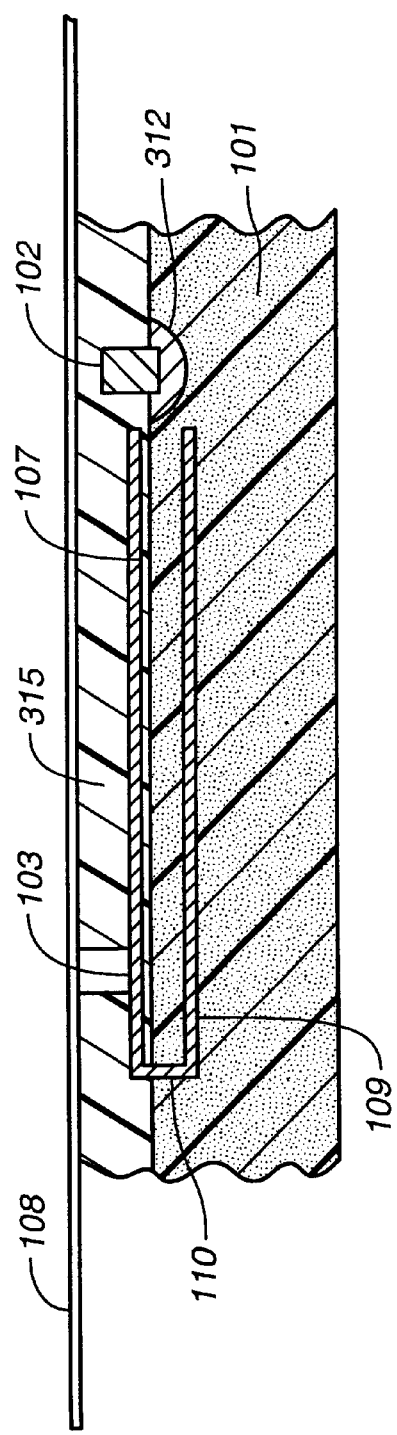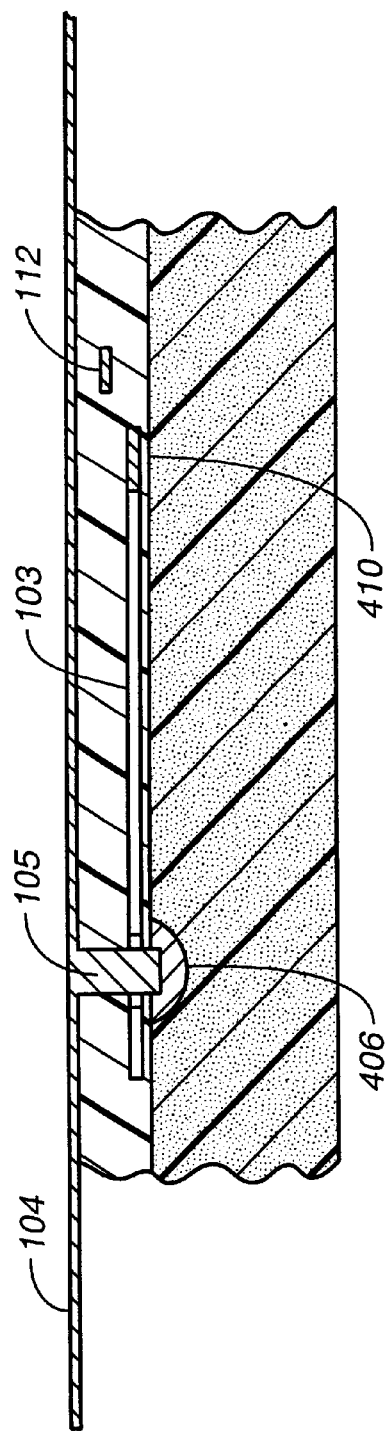

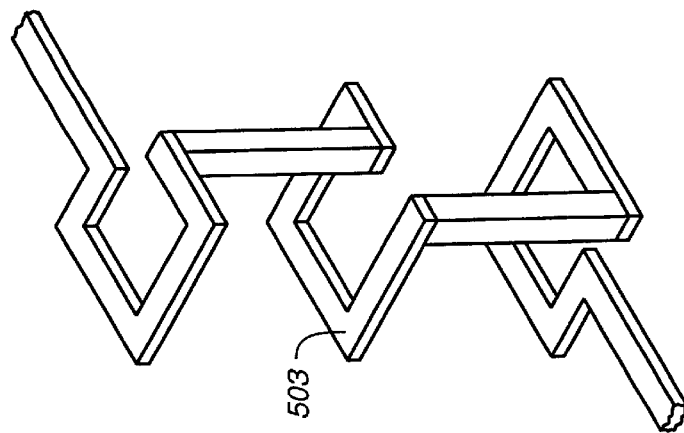
FIG._7
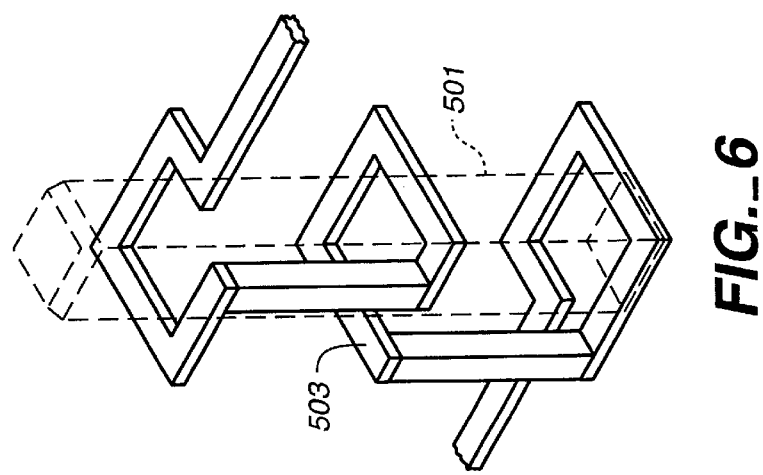
FIG._6
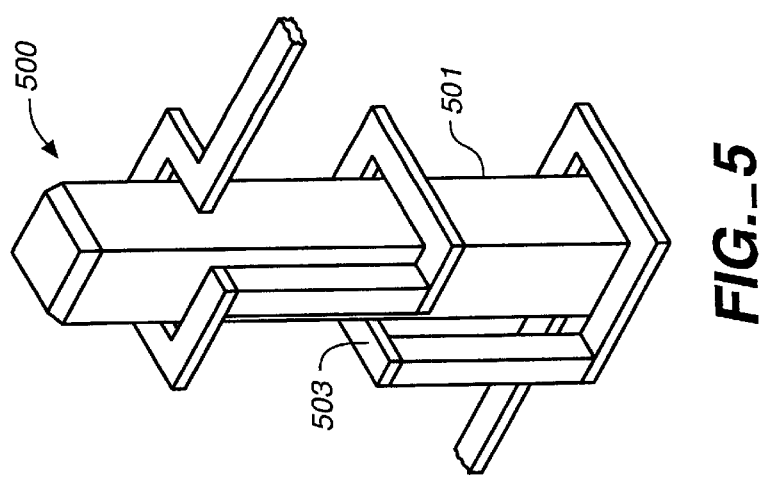
FIG._5

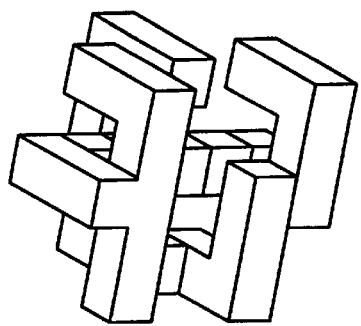
FIG._11
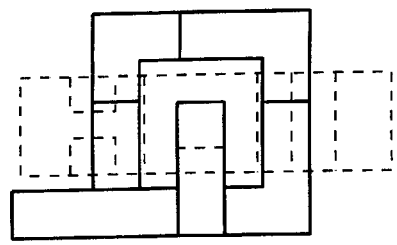
FIG._12
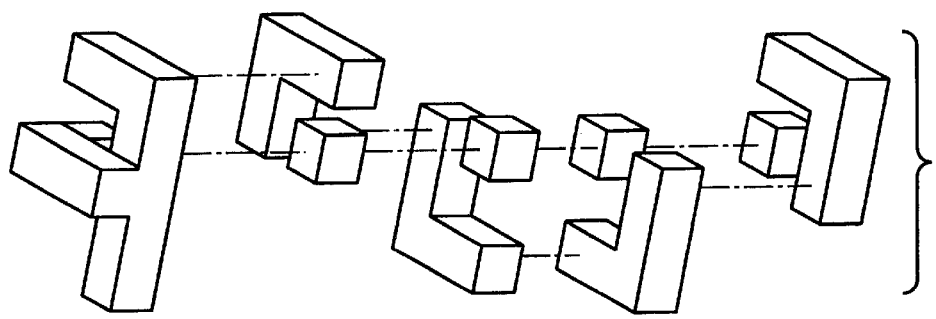
FIG._10
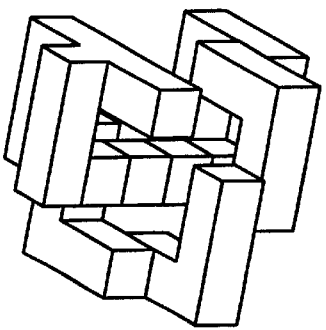
FIG._9
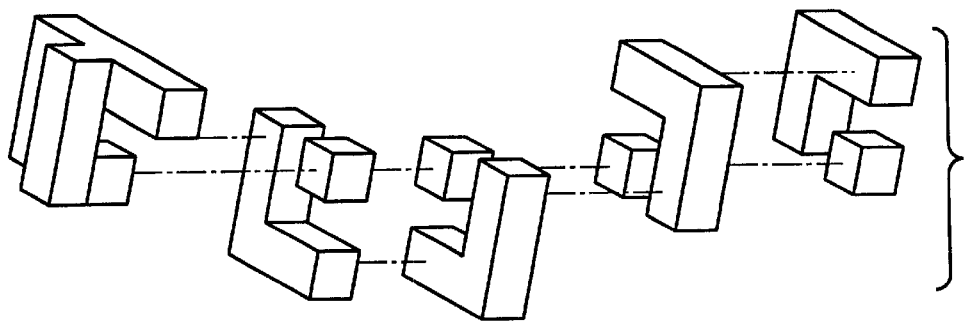
FIG._8

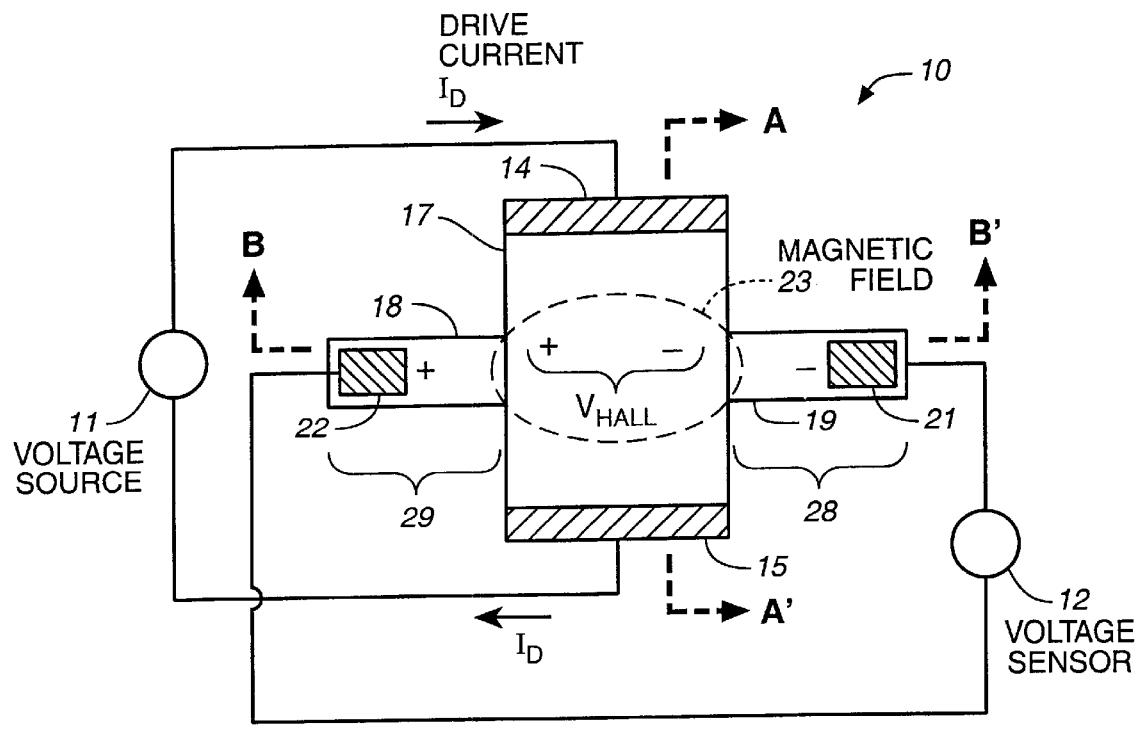
FIG._13A
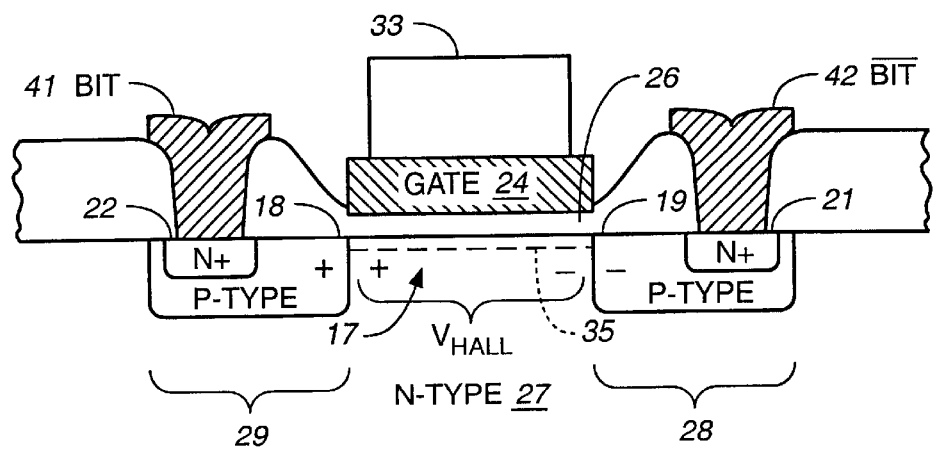
FIG._13B

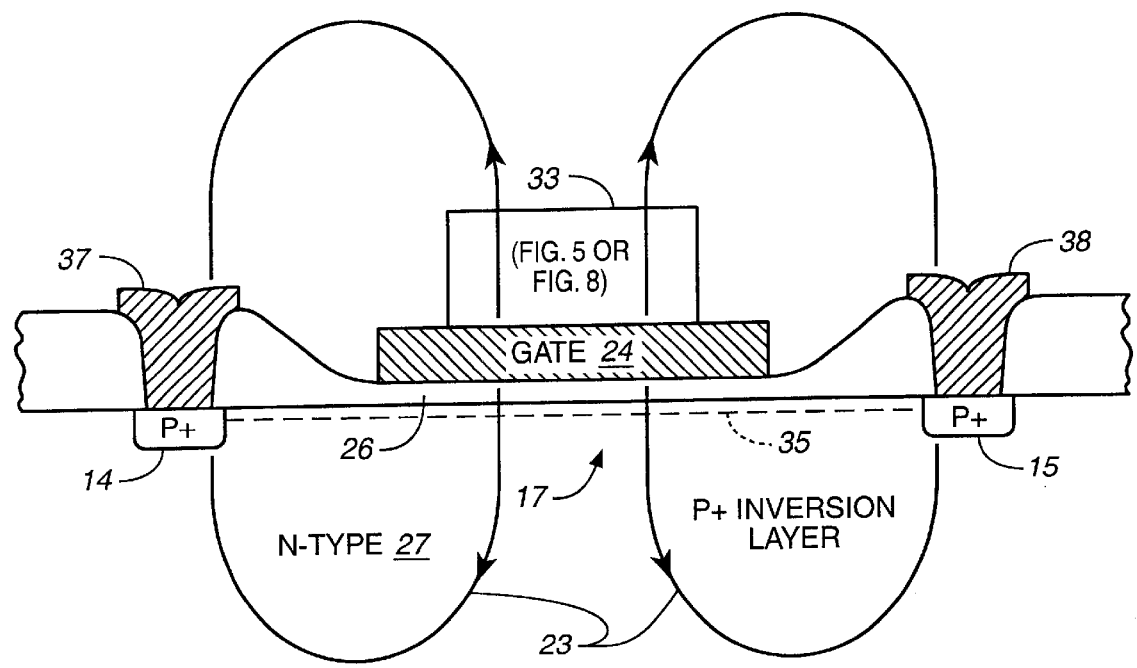
FIG._13C
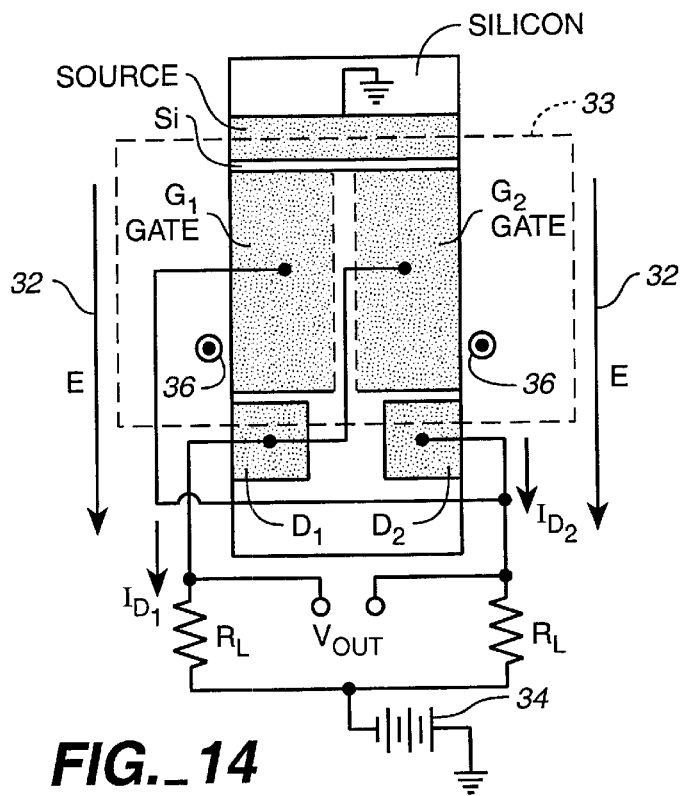
FIG._14

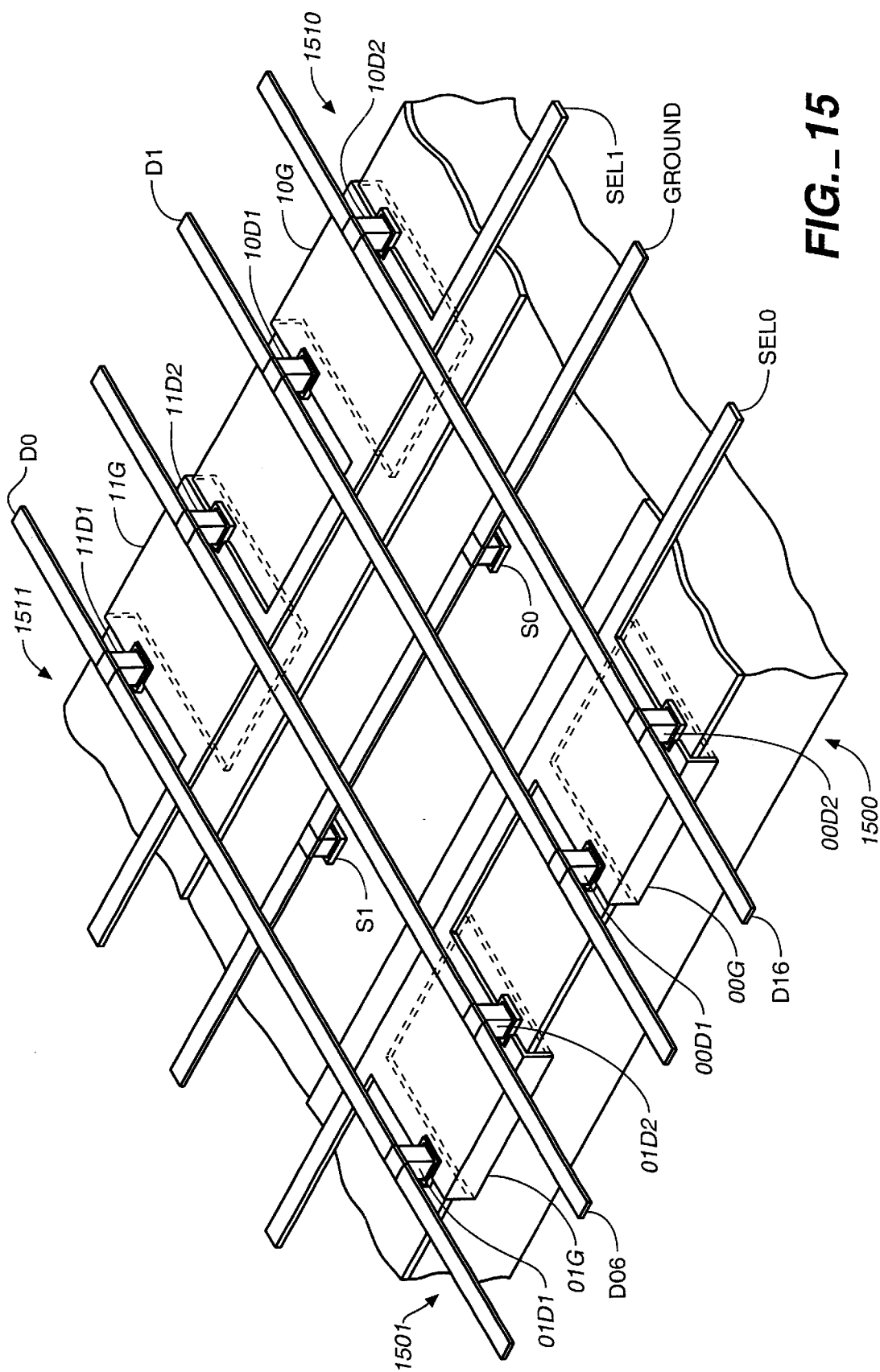
FIG._15

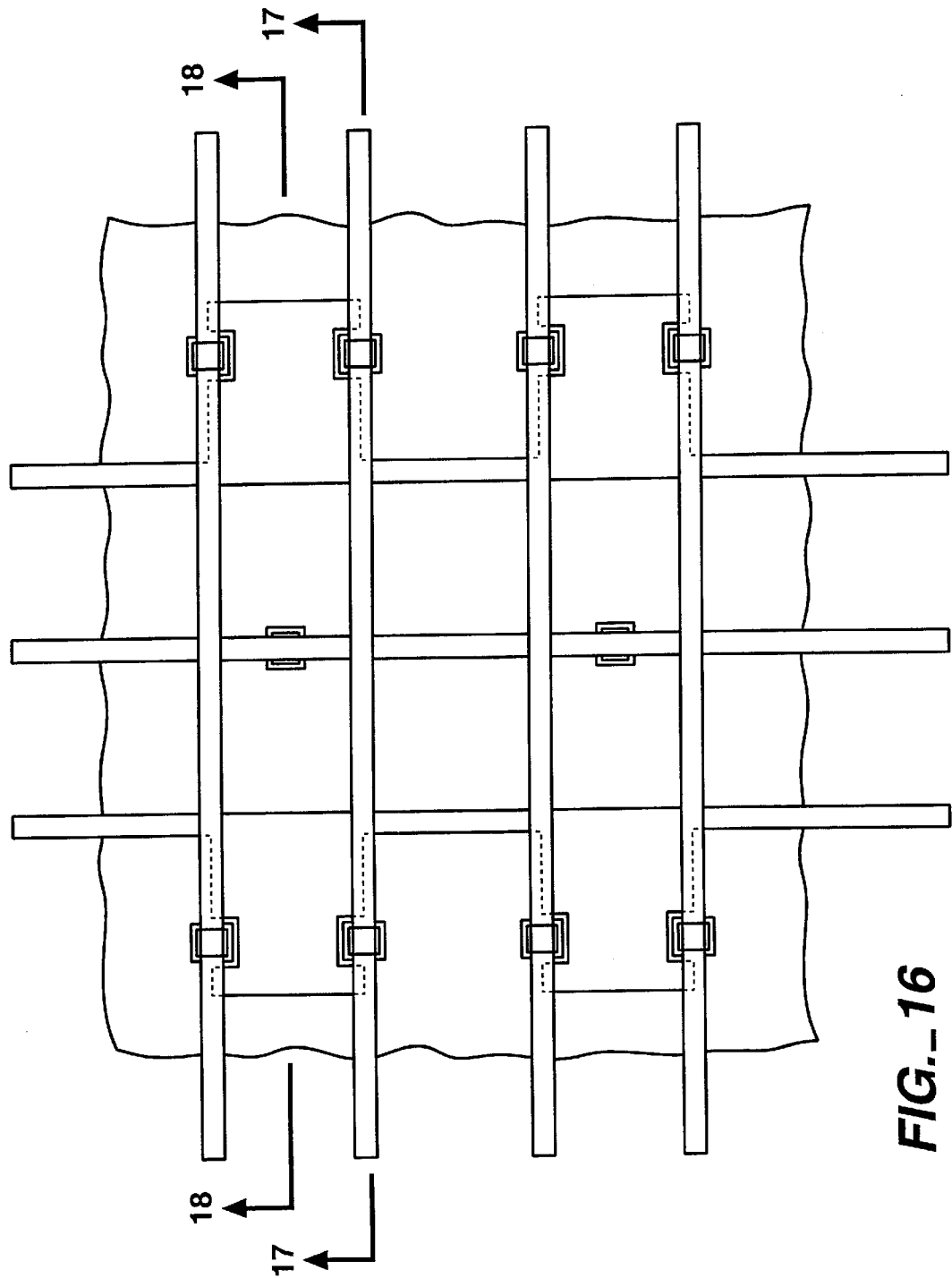
FIG._16

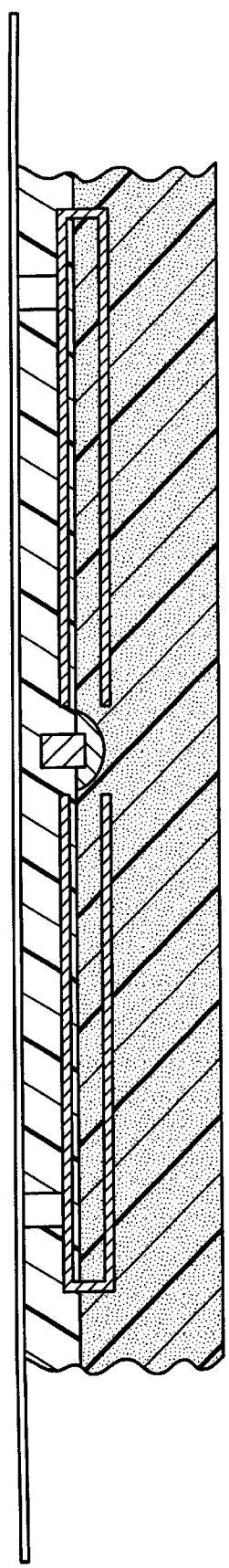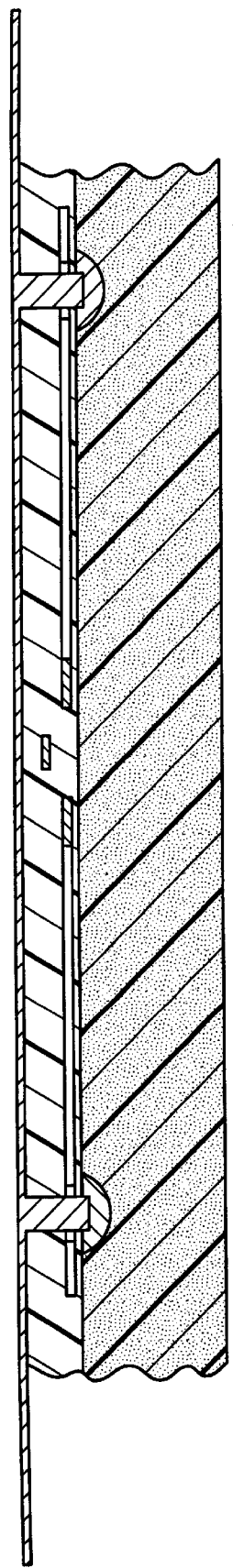

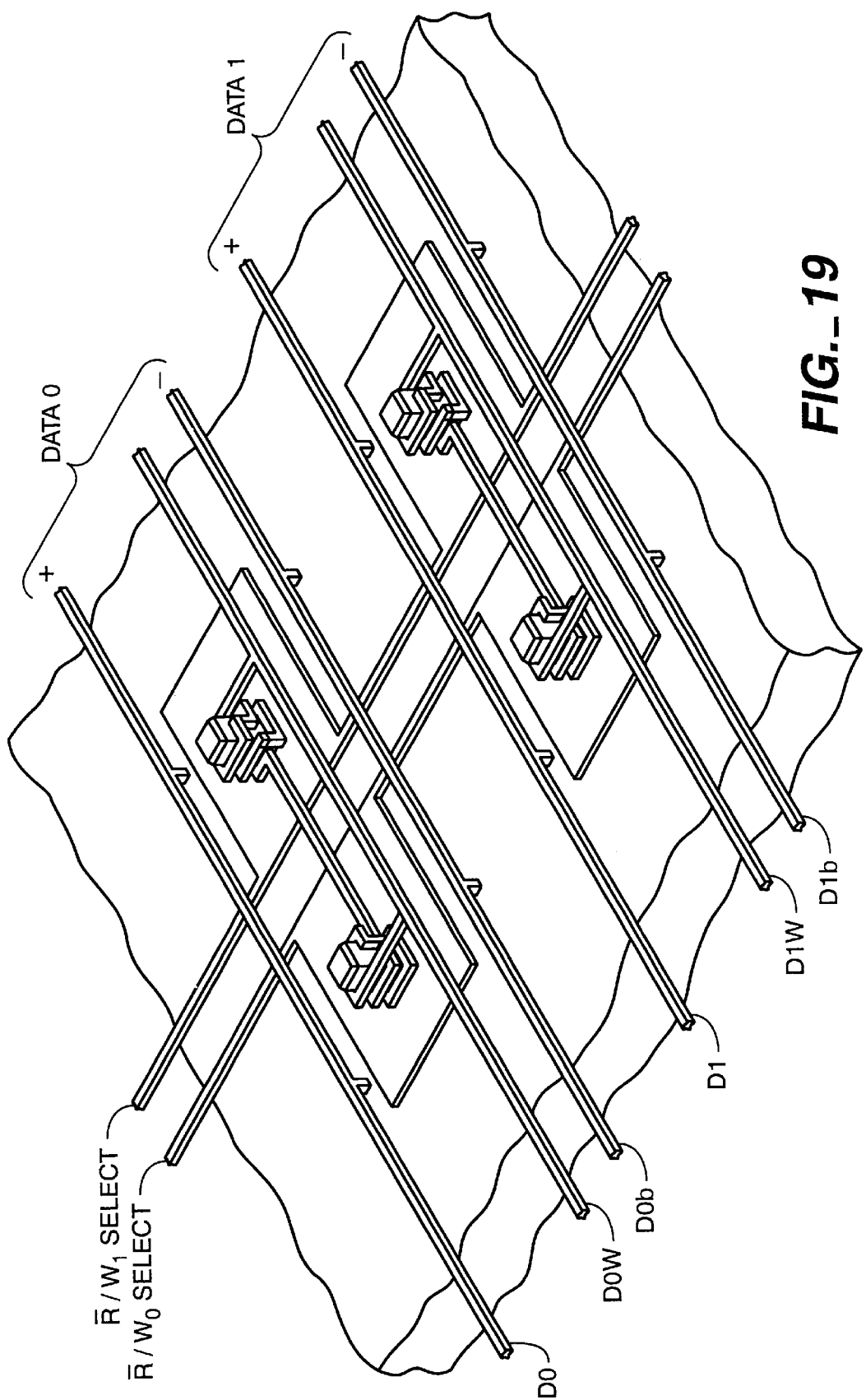
FIG._19

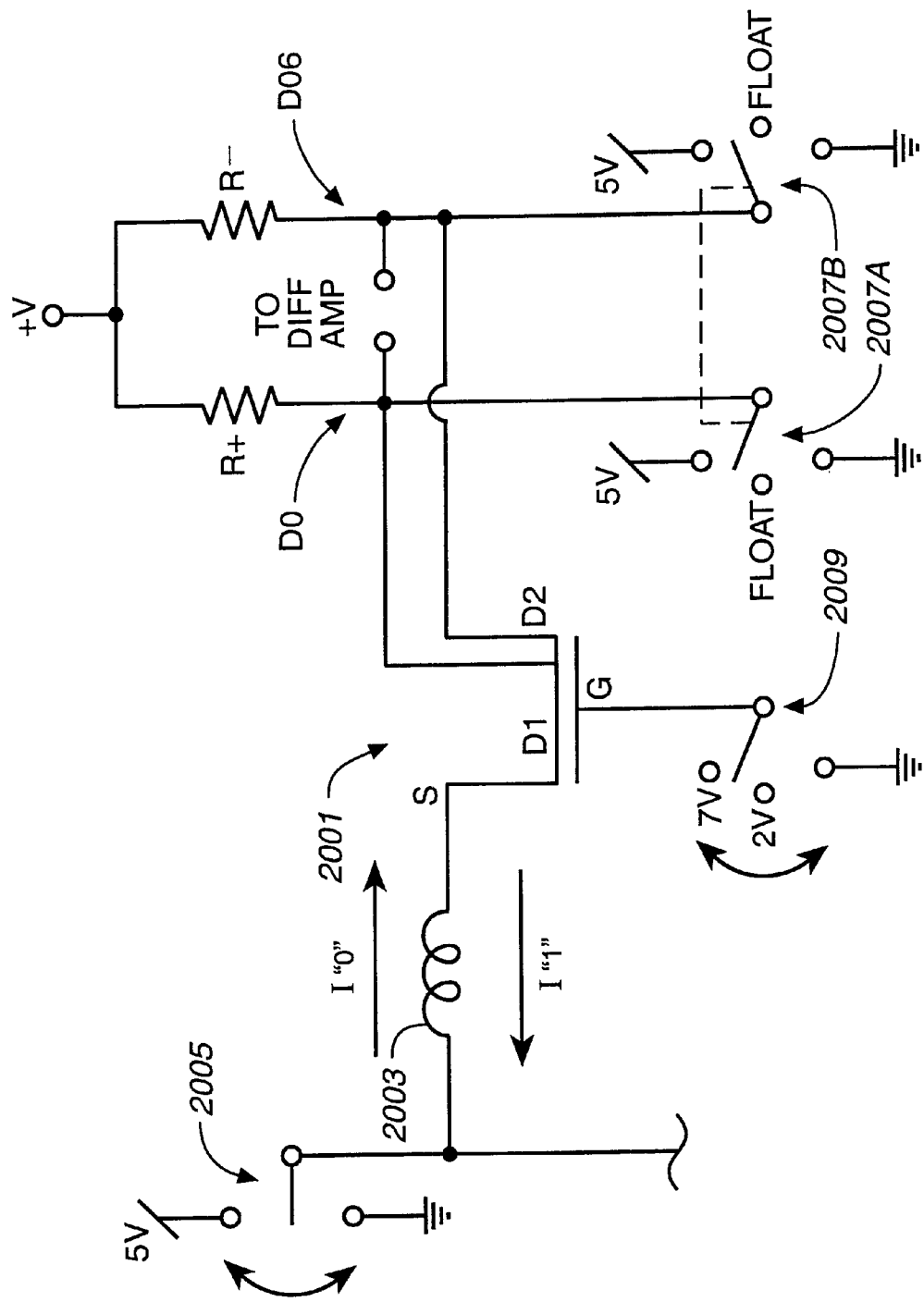
FIG._20

| STEP | | MASK # | APPROXIMATE THICKNESS °A |
|---|---|---|---|
| 1 | (WAFER WITH NON-MEMORY ELEMENTS IN PLACE) | | |
| 2 | (PASSIVATE NON-MEMORY AREAS) | | |
| 3 | | | |
| 4 | PATTERN BOTTOM LEG OF "C-CLAMP" | 1A | |
| 5 | ETCH TRENCH IN SILICON (WHERE CLAMP IS TO GO.) | | (10,000) |
| 6 | OXIDIZE | | 500 |
| 7 | DEPOSIT BOTTOM OF C-CLAMP MAGNETICS | | 10,000 |
| 8 | PATTERN C-CLAMP | 2A | |
| 9 | ETCH MAGNETICS | | |
| 10 | DEPOSIT OXIDE | | 250 |
| 11 | PATTERN SOURCE AND DRAIN (OPEN TO Si) | 3A | |
| 12 | DEPOSIT CHANNEL - (SO1 SELECTIVELY) | | 1,500 |
| 13 | DEPOSIT GATE INSULATION - $SiO_2$ / $Si_3N_4$ | | 250 |
| 14 | PATTERN SOURCE AND DRAIN | 4A | |
| 15 | IMPLANT SOURCE AND DRAIN | | |
| 16 | DEPOSIT OXIDE | | 500 |
| 17 | PATTERN SOURCE AND DRAIN CONTACTS | 5A | |
| 18 | DEPOSIT 1ST LAYER METAL | | 5,000 |
| 19 | PATTERN 1ST LAYER METAL | 6A | |
| 20 | DEPOSIT 1ST LAYER INSULATION | | 2,000 |
| 21 | PATTERN INSULATION - OPENING "VERTICAL POST" AND CHANNEL | 7A | |
| 22 | DEPOSIT MAGNETIC POST | | 3,000 |
| 23 | PATTERN POST | 8A | |
| 24 | PLANARIZE WITH INSULATION | | 500 |
| 25 | PATTERN CONTACT TO POST | 9A | |
| 26 | DEPOSIT TWO VERTICAL MAGNETIC POSTS | | 10,000 |
| 27 | PATTERN TWO VERTICAL MAGNETIC POSTS | 10A | |
| 28 | PLANARIZE WITH INSULATION | 11A | |
| 29 | PATTERN CONTACTS TO TWO VERTICAL MAGNETIC POSTS | 12A | |

FIG._21A

| STEP | MASK # | APPROXIMATE THICKNESS |
|---|---|---|
| 30 DEPOSIT TOP OF C CLAMP | | 10,000 |
| 31 PATTERN TOP OF CLAMP | 13A | |
| 32 PLANARIZE WITH INSULATION | | |
| 33 PATTERN INSULATION - CONTACT TO CLAMP | 14A | |
| 34 CLEAN PATTERNED SUBSTRATES | | |
| 35 DEPOSIT 2ND LAYER CONDUCTIVE MATERIAL | | 10,000 |
| 36 PATTERN 2ND LAYER CONDUCTIVE MATERIAL | 15A | |
| 37 DEPOSIT 1ST TOPSIDE INSULATION | | 5,000 |
| 38 PATTERN 1ST TOPSIDE INSULATION | 16A | |
| 39 DEPOSIT 3RD LAYER CONDUCTIVE MATERIAL | | 10,000 |
| 40 PATTERN 3RD LAYER CONDUCTIVE MATERIAL | 17A | |
| 41 DEPOSIT 2ND TOPSIDE INSULATION | | 5,000 |
| 42 PATTERN 2ND TOPSIDE INSULATION | 18A | |

FIG._21B

| FIG._21A | FIG._21B |

FIG._21

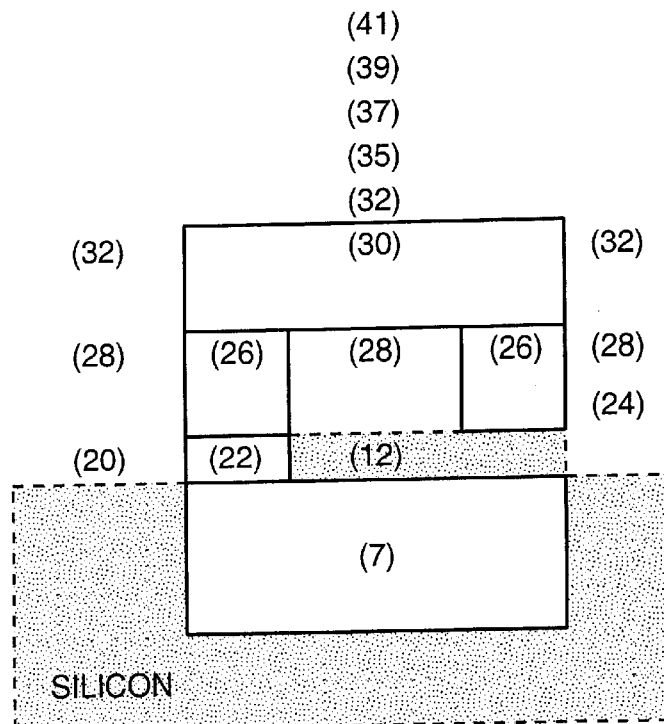
FIG._22
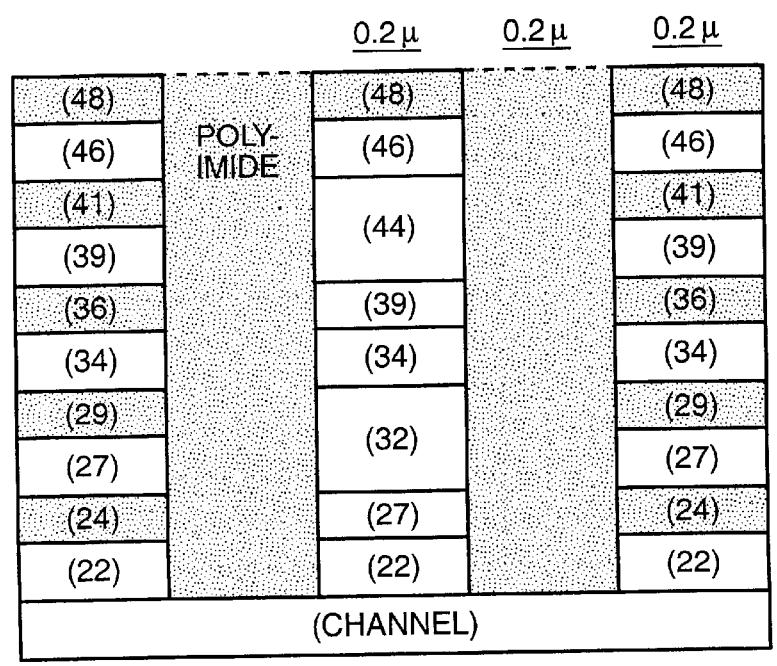
FIG._24

| STEP | | MASK # | APPROXIMATE THICKNESS °A |
|---|---|---|---|
| 1 | "PROCESSED WAFERS" - W/PASSIVATION LAYER | | |
| 2 | | | |
| 3 | | | |
| 4 | | | |
| 5 | | | |
| 6 | NMOS MagFet BUILT | | |
| 7 | | | |
| 8 | | | |
| 9 | | | |
| 10 | | | |
| 11 | | | |
| 12 | | | |
| 13 | | | |
| 14 | | | |
| 15 | DEPOSIT 1ST LAYER METAL | | 5,000 |
| 16 | PATTERN 1ST LAYER METAL | 4 | |
| 17 | ETCH METAL | | |
| 18 | DEPOSIT 1ST LAYER INSULATION | | 2,500 |
| 19 | PATTERN 1ST LAYER INSULATION / OPEN GATE | 5 | |
| 20 | ETCH INSULATION | | |
| 21 | CLEAN PATTERNED SUBSTRATES | | |
| 22 | DEPOSIT NiFe MAGNETIC MATERIAL | | 2,000 |
| 23 | PATTERN 1ST LEVEL COIL + POST | 6 | |
| 24 | DEPOSIT 1ST LEVEL POLYIMIDE | | 1,000 |
| 25 | PATTERN 1ST LEVEL POLYIMIDE | 7 | |
| 26 | CLEAN PATTERNED SUBSTRATES | | |
| 27 | DEPOSIT NiFe MAGNETIC MATERIAL | | 2,000 |
| 28 | PATTERN 2ND LEVEL COIL + POST | 8 | |
| 29 | DEPOSIT 2ND LEVEL POLYIMIDE | | 1,000 |
| 30 | PATTERN 2ND LEVEL POLYIMIDE | 9 | |
| 31 | CLEAN PATTERNED SUBSTRATES | | |
| 32 | DEPOSIT NiFe MAGNETIC MATERIAL | | 1,500 |
| 33 | PATTERN POST - CATCH-UP | 10 | |
| 34 | DEPOSIT NiFe MAGNETIC MATERIAL | | 2,000 |

FIG._23A

| STEP | | MASK # | APPROXIMATE THICKNESS |
|---|---|---|---|
| 35 | PATTERN 3RD LEVEL COIL + POST | 11 | 1,000 |
| 36 | DEPOSIT 3RD LEVEL POLYIMIDE | | |
| 37 | PATTERN 3RD LEVEL POLYIMIDE | 12 | 2,000 |
| 38 | CLEAN PATTERNED SUBSTRATES | | |
| 39 | DEPOSIT NiFe MAGNETIC MATERIAL | | |
| 40 | PATTERN 4TH LEVEL COIL + POST | 13 | 1,000 |
| 41 | DEPOSIT 4TH LEVEL POLYIMIDE | | |
| 42 | PATTERN 4TH LEVEL POLYIMIDE | 14 | |
| 43 | CLEAN PATTERNED SUBSTRATES | | |
| 44 | DEPOSIT NiFe MAGNETIC MATERIAL | | 1,500 |
| 45 | PATTERN POST - CATCH-UP | 15 | |
| 46 | DEPOSIT NiFe MAGNETIC MATERIAL | 16 | 2,000 |
| 47 | PATTERN 5TH LEVEL COIL + POST | 17 | 1,000 |
| 48 | DEPOSIT 5TH LEVEL POLYIMIDE | | |
| 49 | PATTERN 5TH LEVEL POLYIMIDE | 18 | 50 |
| 50 | CLEAN PATTERNED SUBSTRATES | | |
| 51 | DEPOSIT 5TH NON-MAG INSULATION | | |
| 52 | PATTERN 5TH LEVEL INSULATION | 19 | 1,500 |
| 53 | CLEAN PATTERNED SUBSTRATES | | |
| 54 | DEPOSIT NiFe MAGNETIC MATERIAL | 20 | 1,000 |
| 55 | PATTERN POST HOOK | | |
| 56 | DEPOSIT 6TH INSULATION | | |
| 57 | PATTERN 6TH LEVEL INSULATION | 21 | 5,000 |
| 58 | CLEAN PATTERNED SUBSTRATES | | |
| 59 | DEPOSIT 1ST TOP CONDUCTIVE MATERIAL | | |
| 60 | PATTERN 1ST TOP CONDUCTIVE MATERIAL | 22 | 5,000 |
| 61 | DEPOSIT 1ST TOPSIDE INSULATION | | |
| 62 | PATTERN 1ST TOPSIDE INSULATION | 23 | |
| 63 | DEPOSIT 2ND TOP CONDUCTIVE MATERIAL | | 5,000 |
| 64 | PATTERN 2ND TOP CONDUCTIVE MATERIAL | 24 | 5,000 |
| 65 | DEPOSIT 2ND TOPSIDE INSULATION | | |
| 66 | PATTERN 2ND TOPSIDE INSULATION | | |

| FIG._23A | FIG._23B |

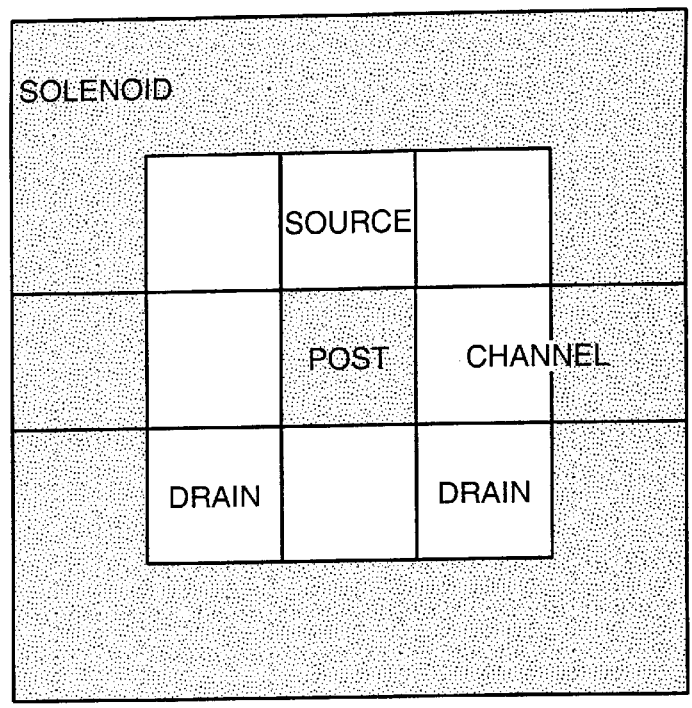
FIG._25
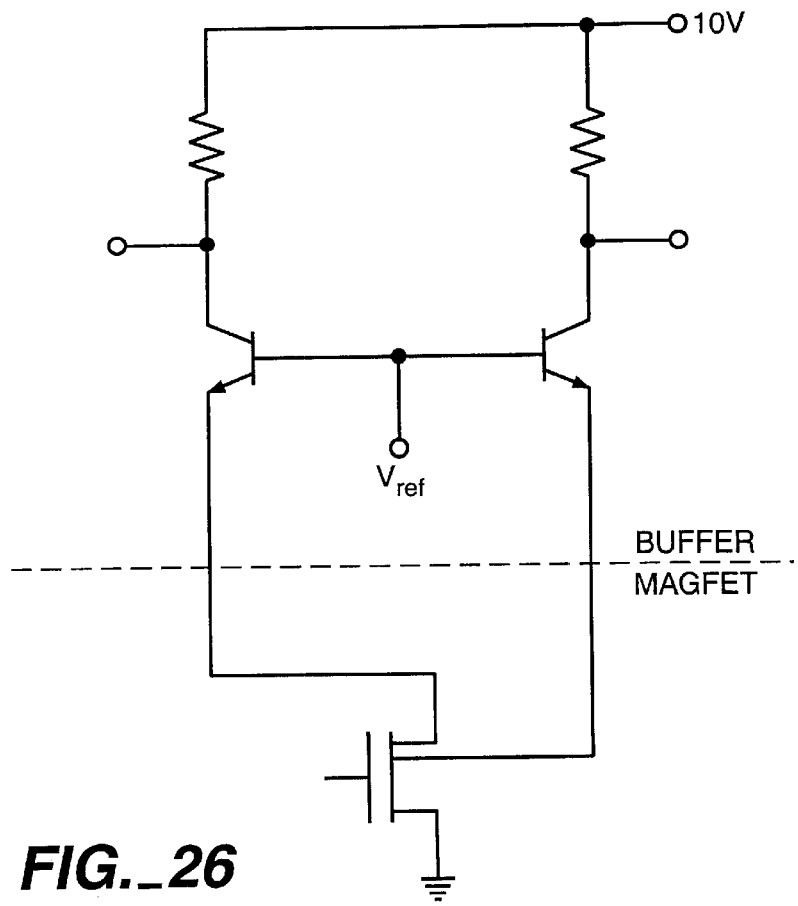
FIG._26

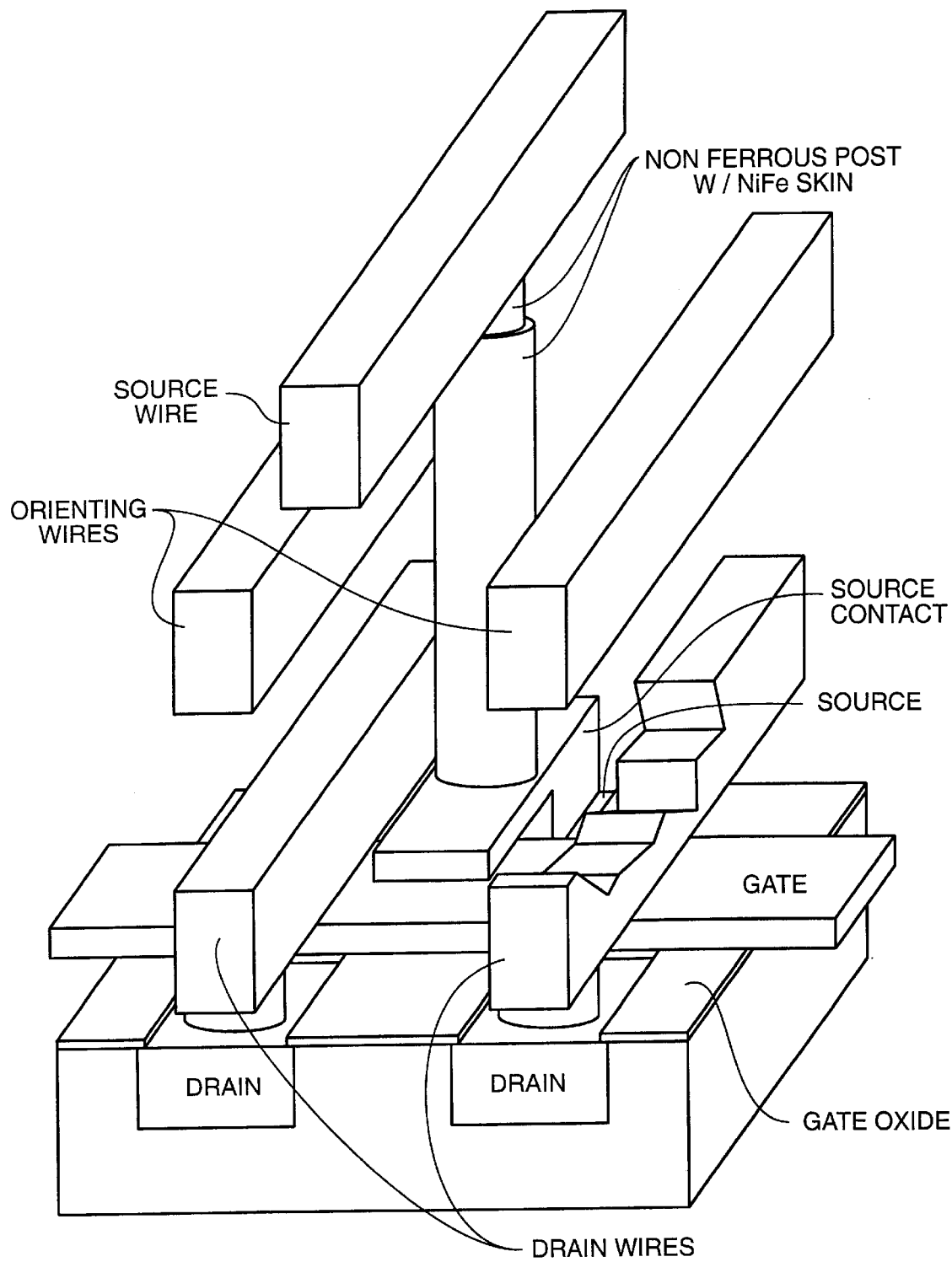
FIG._27

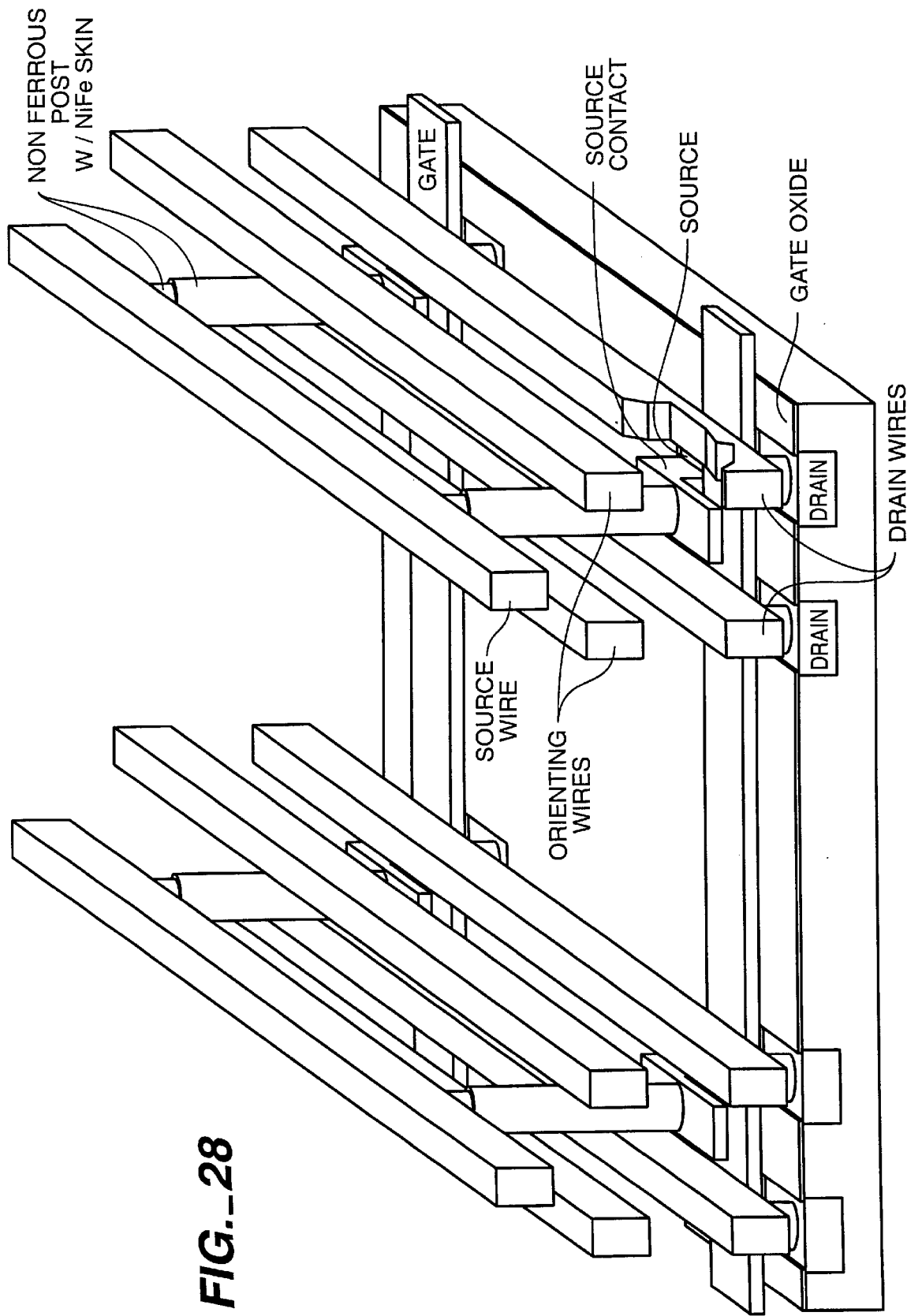
FIG._28

FIG._29A

TO CREATE A MAGNETIC CYLINDER AROUND A CONDUCTING POST ABOVE A MAGFET SENSOR AND REQUISITE CONNECTIONS.

PROCESS: C1 — ORIENTING WIRES AT TOP OF POST

REVISE STANDARD EXTEL PROCESS AS FOLLOWS:

|  |  | STANDARD |  |
|---|---|---|---|
| FIELD OXIDE: | 4,000 °A | 5,000 |  |
| 2nd POLY SILICON | 500 °A | 3,500 | 1st POLY |
| FIRST INSULATOR | 250 °A | 8,000 |  |
| FIRST METAL | 5,500 °A | 5,500 |  |
| SECOND INSULATOR | 15,000 °A | 15,000 | SOG |
|  |  | TIN/Ti is: | 800°A/500°A |

POST TO CHANNEL: 100°A+500°A+250°A+1300°A
= 2150°A

STANDARD EXTEL PROCESS, except 2nd POLY is 500°A

FOLLOW "DUAL POLY PROCESS"

AFTER 2nd POLY PATTERNED

1. DEPOSIT 1st STEP OF 1st INSULATOR LAYER
2. PATTERN INSULATOR (OPEN CONTACTS)
3. DEPOSIT Ti/TiN — 250 °A
4. PATTERN SOURCE TO POST (Ti/TiN) &CONTACTS 500+800 °A — THINNER IF POSSIBLE
5. DEPOSIT 2nd STEP OF 1st INSULATOR LAYER — 500 °A
6. PATTERN INSULATOR (OPEN POST AREA) 1.2μ ASSUMPTION: Can make 1.2μ HOLE; 2X1 aspect ratio.
7. PATTERN PLATING PHOTORESIST 1.2μ
8. ELECTROLESS PLATE Au      ASSUMPTION: Sources are commoned to ground (−) and can provide contact for plating.
9. REMOVE RESIST
10. ETCH Au 0.15μ

| | | | |
|---|---|---|---|
| 11 | ELECTROLYTICALLY PLATE NiFe | | |
| 12 | CLEAN WAFER | | |
| 13 | USE SOG AS 1st INSULATOR LAYER | 1.0µ | 350 °A | ASSUMPTION: Can make 1st level insulation using SOG. Make post & contacts but no source contacts. |
| 14 | PATTERN; 1st INSULATOR | | |
| 15 | REMOVE NiFe | | |
| 16 | DEPOSIT Ti/TiN/Al - 1st METAL | -1,300+5,500 °A | STANDARD EXTEL PROCESS |
| 17 | MASK & ETCH Al/TiN | | STANDARD EXTEL PROCESS |
| 18 | DEPOSIT SOG LAYER | 15,000 °A | STANDARD EXTEL PROCESS |
| 19 | PATTERN INSULATOR LAYER | | STANDARD EXTEL PROCESS |
| 20 | DEPOSIT TiN/Al - 2nd METAL | 5,500 °A | STANDARD EXTEL PROCESS |
| 21 | MASK & ETCH Al/TiN | | STANDARD EXTEL PROCESS |
| 22 | DEPOSIT INSULATOR LAYER | 5,500 °A | STANDARD EXTEL PROCESS |
| 23 | PATTERN INSULATOR LAYER | | STANDARD EXTEL PROCESS |

FIG._29B

| FIG._29A | FIG._29B |

FIG._29

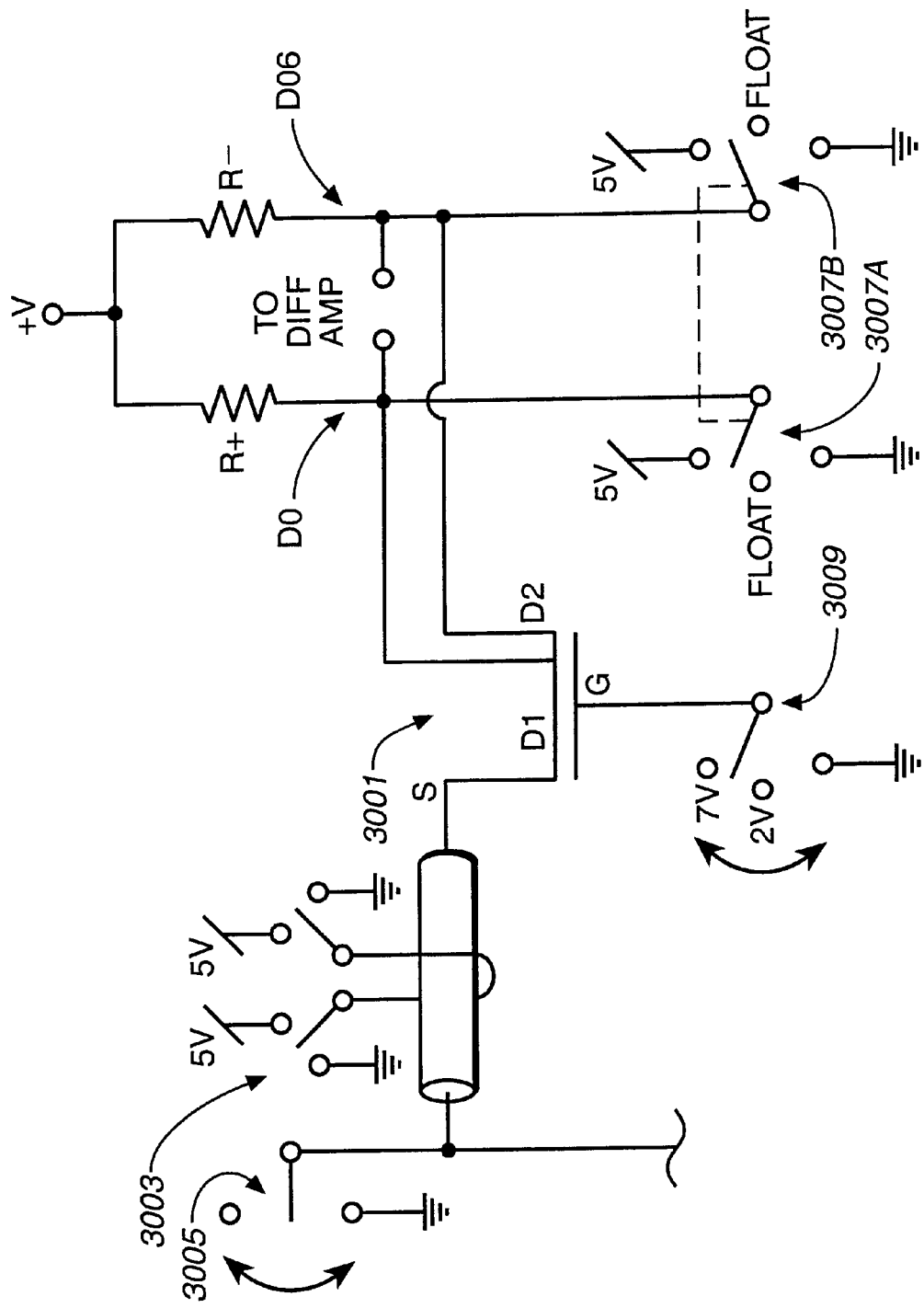
FIG._30

HIGH-EFFICIENCY MINIATURE MAGNETIC INTEGRATED CIRCUIT STRUCTURES

This application is a divisional, of application Ser. No. 09/083,272, filed May 12, 1998 now U.S. Pat. No. 6,051,441.

1. Field of the Invention

The present invention relates to magnetic integrated circuit structures suitable for use in magnetic semiconductor memories.

2. State of the Art

Computer memory technology has experienced profound advances in the course of the last two decades. An early enabling computer memory technology was magnetic core memory technology. To form magnetic core memories, seemingly innumerable miniature ferrite cores, toroid-shaped, were painstakingly interwoven within a fine matrix of wires, three or more wires passing through the center of each core. By applying a magnetizing current, each core could be placed in one of two different magnetic states, representing a logic 1 and a logic 0, respectively. A coincident current technique was used to select particular cores for the reading and writing of data. Core memory is non-volatile, meaning that data remains unchanged over power cycles: power can be removed from the memory and later reapplied without changing the contents of the memory. Core memory is also "radiation-hard," i.e., unaffected in its operation by ionizing radiation such as gamma rays. Nevertheless, by and large, because of the labor-intensive nature of core memory manufacture and its size, core memory has long been abandoned in favor of semiconductor memory.

Currently the most popular memory technology is MOS DRAM (Metal-Oxide-Semiconductor Dynamic Random Access Memory) technology. In MOS DRAMs, a data bit is stored by injecting charge into or removing charge from a single storage capacitor, through a single transistor. Very dense MOS DRAM chips of up to 256 Mb capacity have been achieved. DRAMs, like MOS devices generally, are low in power consumption. Because leakage occurs from the storage capacitor, however, DRAMs must be refreshed (have the correct charge on each individual storage capacitor restored) at frequent intervals. Furthermore, as compared to core memory which is non-volatile and radiation-hard, DRAM is neither. The need for non-volatile memory and rapid-access memory therefore requires the use of memory hierarchies including multiple different types of memory, i.e., both non-volatile memory (such as FLASH, EEPROM, Ferroelectric memory, EPROM disk, tape, etc.) and volatile memory (such as DRAM, SRAM, etc.). Flash, EEPROM and Ferroelectric memory types provide non-volatility but have a limited number of write cycles before wear-out and in general the write cycle is substantially slower than the read cycle. Memory hierarchies in turn require memory I/O architectures of varying degrees of sophistication. In the case of personal computers, starting up, or "booting" the computer can take a considerable amount of time as a consequence of the need to transfer information from non-volatile to volatile memory.

Clearly, a non-volatile semiconductor memory comparable to DRAM in terms of density, power consumption and write cycle speed is much to be desired. Several memory structures have been proposed to this end, as exemplified by U.S. Pat. Nos. 5,329,480, 5,295,097, 5,068,826, 4,887,236, 4,803,658, and 3,727,199, among others. Unfortunately, efforts to perfect such magnetic semiconductor memories have been largely unsuccessful. One impediment has been the low sensitivity of prior-art magnetic field sensing devices and the inability to make small integratable permanent magnets. A well-known sensing mechanism is that of carrier deflection, using a device known as a "magFET," for example. A magFET is a Field Effect Transistor (FET) having a single source and two or more drains. A magnetic field, when present in the channel region of the device, can deflect carriers away from one of the drains and toward the other drain(s), depending on the strength and direction of the magnetic field.

More particularly, charge carriers passing through a magnetic field experience a force known as the Lorentz force that tends to deflect the carriers according to the direction of the magnetic field. The Lorentz force (F) experienced by a charged carrier is given by the vector equation $F=qv\times B$, where q is the charge of the carrier, v is the velocity of the carrier and B is the magnetic field through which the carrier is passing (v & B being tensor quantities). (See, for example, C. S. Roumenin, *Handbook of Sensors and Actuators*, Volume 2, Section 1.3). The Lorentz force, and hence carrier deflection, is maximized when the magnetic field is substantially orthogonal to the direction of carrier travel. In general, the prior art falls far short of achieving an orthogonal field of sufficient magnitude to allow an integrated sensor to generate a detectable signal.

Other shortcomings of proposed prior-art magnetic semiconductor memories also appear. In order to compete successfully with DRAM, a magnetic semiconductor memory bit cell (after giving effect to the gain provided by additional turns in the magnetic structure) should require no more magnetizing current through its permanent magnet structure of several turns than is available from a single, small-size MOS device, which is usually on the order of 2 milliamps or less. Furthermore, the magnetics of such a cell must be sufficiently well-behaved as to not adversely affect adjacent cells in a memory array. In general, the prior art has been unable to provide a magnetic semiconductor element that satisfies all commercial requisites.

SUMMARY OF THE INVENTION

The present invention, generally speaking, provides a magnetic memory element that is single domain in nature and has a geometry that mitigates the effects of half-select noise. In a preferred embodiment, the magnetic memory element takes the form of a magnetic post or tube having an aspect ratio in the range of 2:1 (more preferably 4:1). The outside diameter of the magnetic tube or post is preferably less than 0.8 microns, more preferably 0.6 microns or less. The magnetic post or tube then functions as a single magnetic domain. In the case of a magnetic tube, the skin of the tube is formed of a magnetic material and the interior of the tube is formed of a non-magnetic material. Suitable non-magnetic materials include copper, gold and silicon. The coercivity of the magnetic tube structure may be adjusted by adjusting the thickness of the magnetic skin. As a result, the magnetic memory element is readily scalable to smaller geometries as lithographic techniques improve. The combination of very small, single-domain size and a relatively large aspect ratio results in uniquely desirable properties. Current levels within any reasonable expectation operate to switch the state of the magnetic tube only when the magnetic tube is destabilized by running current through it. With current flowing through the magnetic tube, its state may be readily changed by running modest currents in opposite directions through two parallel conductors, one on each side of the magnetic tube. When the magnetic tube is switched, the single domain nature of the magnetic tube produces a signal that is typically 5–15 times stronger than signals produced by conventional magnetic memory elements. The magnetic tube functions as a vertical magnetic field generator and may be formed in intimate proximity to a magnetic field sensor such as above the gate of a magFET.

BRIEF DESCRIPTION OF THE DRAWING

The present invention may be further understood from the following description in conjunction with the appended drawing. In the drawing:

FIG. 1 is a perspective view of one magnetic integrated circuit structure suitable for use in magnetic semiconductor memories;

FIG. 2 is a plan view of the magnetic integrated circuit structure of FIG. 1;

FIG. 3 is a sectional view along section III—III of the magnetic integrated circuit structure of FIG. 2;

FIG. 4 is a sectional view along section IV—IV of the magnetic integrated circuit structure of FIG. 2;

FIG. 5 is a perspective view of another magnetic integrated circuit structure suitable for use in magnetic semiconductor memories;

FIG. 6 differs from FIG. 5 in that the core of the solenoid is shown in dashed outlines;

FIG. 7 differs from FIG. 6 in that only the coil of the solenoid is shown;

FIG. 8 is an exploded view of a further magnetic integrated circuit structure suitable for use in magnetic semiconductor memories;

FIG. 9 is an isometric view of the magnetic integrated circuit structure of FIG. 8;

FIG. 10 is a rotated exploded view of the magnetic integrated circuit structure of FIG. 8;

FIG. 11 is a rotated isometric view of the magnetic integrated circuit structure of FIG. 8;

FIG. 12 is a plan view of the magnetic integrated circuit structure of FIG. 8;

FIG. 13A, FIG. 13B and FIG. 13C are schematic diagrams of one magnetic semiconductor memory cell in which the magnetic integrated circuit structure of FIG. 5 or FIG. 8 is or can be combined with one conventional magnetic field sensor arrangement;

FIG. 14 is a schematic diagram of one magnetic semiconductor memory cell in which the magnetic integrated circuit structure of FIG. 5 or FIG. 8 is or can be combined with another conventional magnetic field sensor arrangement;

FIG. 15 is a perspective view of a magnetic semiconductor memory cell array using the magnetic integrated circuit structure of FIG. 1;

FIG. 16 is a plan view of the magnetic semiconductor memory cell array of FIG. 15;

FIG. 17 is a sectional view along section XVII—XVII of the magnetic semiconductor memory cell array of FIG. 16;

FIG. 18 is a sectional view along section XVIII—XVIII of the magnetic semiconductor memory cell array of FIG. 16;

FIG. 19 is a perspective view of a magnetic semiconductor memory cell array using the magnetic integrated circuit structure of FIG. 5;

FIG. 20 is an equivalent circuit diagram of a cell of magnetic semiconductor memory cell array of FIG. 19;

FIG. 21 is a list of process flow steps for forming a magnetic integrated circuit structure like that of FIG. 1, in accordance with one method;

FIG. 22 is a cross-sectional view, corresponding to the process flow of FIG. 21 of a magnetic integrated circuit structure like that of FIG. 1;

FIG. 23 is a list of process flow steps for forming a magnetic integrated circuit structure like that of FIG. 5, in accordance with one method;

FIG. 24 is a cross-sectional view corresponding to the process flow of FIG. 23, of a magnetic integrated circuit structure like that of FIG. 5;

FIG. 25 is a plan view corresponding to the cross-sectional view of FIG. 24;

FIG. 26 is a schematic diagram of a buffer circuit coupled to a memory cell of the present invention.

FIG. 27 is a perspective view of another magnetic integrated circuit structure suitable for use in magnetic semiconductor memories;

FIG. 28 is a perspective view of a magnetic semiconductor memory cell array using the magnetic integrated circuit structure of FIG. 27;

FIG. 29 is a list of process flow steps for forming a magnetic integrated circuit structure like that of FIG. 27, in accordance with one method; and FIG. 30 is an equivalent circuit diagram of a cell of magnetic semiconductor memory cell array of FIG. 28, with associated circuitry.

DETAILED DESCRIPTION OF THE PREFERRED EMBODIMENTS

Referring now to FIG. 1 there is shown a perspective view of one magnetic integrated circuit structure suitable for use in magnetic semiconductor memories. The magnetic integrated circuit structure 100 is formed on a semiconductor (e.g., silicon) substrate 101 and incorporates a magFET, i.e., an FET having a single source region contacted by a source contact 102, a gate electrode 103, and multiple drains (two are shown) contacted by respective drain contacts 105, 106. The source contact is joined to a source line 112. The respective drain contacts 105, 106 are joined to respective drain lines 104, 108. The magnetic integrated circuit 100 can differ from a conventional magFET, however, in several important respects. Unlike a conventional magFET, the gate electrode 103 of the magnetic integrated circuit 100 is formed of a ferromagnetic material. The gate electrode, or "ferromagnetic gate" 103, is separated from the underlying device channel by a gate oxide layer 107 having a thickness of only a few tens of angstroms. Because of the ferromagnetic gate's very close physical proximity to the device channel, when the ferromagnetic gate is magnetically coupled to a further cooperating ferromagnetic member, a magnetic field may be directed through the device channel with only a small loss of magnetic flux. Among other respects, the magnetic integrated circuit structure 100 differs from the prior art such as U.S. Pat. No. 4,803,658 in that the cooperating ferromagnetic member functions as a vertical magnetic field generator. The '658 patent relies on the Hall effect which is a result of the Lorentz force, whereas in the present structure the Lorentz force itself is used for deflection.

Various cooperating ferromagnetic members are described herein that can function with a conventional two- or three-drain magFET or with two dimensional electron gas interfaces of heterojunctions. A two dimensional electron gas is the thinnest sheet of charge currently known (even thinner than the typical 100A° inversion layer). It is thought that it will be highly sensitive to magnetic fields. The present magnet structures may be expected to strongly deflect particles in the so-called electron gas formed at the interface of two dissimilar materials (i.e., a heterojunction). The magFET may or may not have a ferromagnetic gate. As shown in FIG. 1, one such cooperating ferromagnetic member 109 underlies the device channel so as to oppose the ferromagnetic gate. The cooperating ferromagnetic member 109 is joined to the ferromagnetic gate 103 to form a C-shaped member 110. The C-shaped member 110 surrounds and "clamps" the carrier channel of the magFET incorporated within the structure 100. A gap 111 between the opposite edges of the C-shaped member forms a very narrow magnetic flux gap. The device source is centered within the length of the flux gap. Because the ratio of the length of the C-shaped flux path to the gap can be large and because the fringe field is small, the magnetic efficiency of the structure 100 is high.

A plan view of the structure 100 of FIG. 1 is shown in FIG. 2. Indicated in the plan view of FIG. 2 are sectional views III—III and IV—IV, shown in FIG. 3 and FIG. 4, respectively.

Referring more particularly to FIG. 3, the C-clamp member 110, formed of the ferromagnetic gate 103 and the cooperating ferromagnetic member 109 is clearly seen. The cooperating ferromagnetic member 109 is formed within the semiconductor substrate 101 using techniques described in greater detail hereinafter. A source diffusion region 312 is formed within the semiconductor substrate 101. The ferromagnetic gate 103 is formed above the thin gate oxide layer 107, which is part of the thicker oxide layer 315. The contact 102 to the source diffusion 312 is formed within the oxide layer 315. Of the two drain lines 104 and 108, the drain line 108 may be seen in FIG. 3, formed above the oxide layer 315. Although the lateral locations of the drains have been shown for reference, neither drain is actually visible in FIG. 3.

In FIG. 4, one of the two drain contacts is visible. The drain contact 105 extends down from the drain line and through a "notch" in the ferromagnetic gate 103 so as to contact a source/drain diffusion 406. Because the section illustrated in FIG. 3 is taken at the edge of the ferromagnetic gate 103, the cooperating ferromagnetic member is no longer visible. Within the oxide layer 315 is visible the source line 112. Also visible is a portion of the ferromagnetic gate to which a gate line 410 may be joined. In some designs a third drain can be employed. The center drain may be designed to draw more current than the two outside drains by employing current sources or geometrical layout. This increases the sensitivity of the two outside drains and reduces the required dynamic range of the input of the sense amplifier.

The cooperating ferromagnetic member 109 of the structure 100 of FIG. 1 may be formed by any of several alternative methods.

In one method (describing fabrication of a single device only) a recess is formed in the semiconductor to accommodate the bottom member of the C-clamp, which is then deposited. The surface is planarized, and an oxide layer is grown on the surface of the wafer. The source and drain regions are then patterned and opened up through the oxide to the silicon. Epitaxial silicon is then grown so as to overlie the bottom member of the silicon using a Silicon-On-Insulator (SOI)-like technique described, for example, in J.

A. Friedrich et al., *Jl. Applied Physics*, 65(4), (Feb. 15, 1989), 1713. Once the bottom member of the C-clamp has been embedded in silicon, the remaining fabrication steps may be accomplished in a straight-forward manner using conventional techniques. Finally, the ferromagnetic gate is formed in contact with the cooperating ferromagnetic member, also using conventional techniques.

The process flow followed in accordance with the foregoing method is illustrated in greater detail in FIGS. 22 and 23.

In the embodiment of FIG. 1, the cooperating ferromagnetic member is formed early in the sequence of process steps used to form the structure. Various subsequent processing steps may be required to be performed at high temperatures. Depending on the specific processing steps and specific temperatures involved, the ferromagnetic properties of the cooperating ferromagnetic member may be affected in a manner that cannot be readily controlled. Hence, although the C-clamp member of FIG. 1 exhibits very desirable magnetic properties, it complicates processing. Various other cooperating ferromagnetic structures may also be used. The various cooperating ferromagnetic structures, including the cooperating ferromagnetic structure of FIG. 1, offer different tradeoffs with respect to magnetic properties and process requirements.

Referring to FIG. 5, there is shown a solenoid 500 that may be used as a cooperating ferromagnetic structure in place of the cooperating ferromagnetic structure of FIG. 1. Correlate views of the solenoid are shown in FIG. 6, in which a core 501 of the solenoid is shown in dashed lines, and FIG. 7, in which only a coil 503 of the solenoid is shown. The parallelpiped-shaped core of the solenoid is formed of ferromagnetic material, and should be electrically conducting (e.g, PERMALLOY). The coil of the solenoid is formed of an electrically-conducting material, and should also be ferromagnetic as well. For example, both the core and the coil may be formed of PERMALLOY. An insulating layer is formed between the core and the coil using conventional techniques.

Both the core and the coil are formed layer-by-layer using conventional semiconductor processing techniques. In the example of FIG. 5, the solenoid is formed using a layer structure $M_1I_1V_1M_2I_2V_2M_3I_3V_3$, where M represents a metal (magnetic) layer I represents an insulating layer and V represents a via layer, also of (magnetic) metal. Typically but not necessarily the via layers are considerably thicker than the metal layers.

For example, in the first metal layer M1, the metal layer may be patterned to define a stratum of the core and a surrounding trace. Vias may then be formed in V1, one of relatively large dimensions forming a further stratum of the core, and another of relatively small dimensions connecting to the M1 trace. Note that vias are formed within an insulating layer. Insulating material therefore fills an interstitial gap between the core stratum and the metal trace. Similar steps are then performed for M2 and V2, as will be familiar to those of ordinary skill in the art.

The M3 layer may be processed in like manner as layers M1 and M2. In the case of the V3 layer, however, only a single via is formed as part of the solenoid. The latter via is the final stratum, or "capstone," of the core.

The process flow followed in accordance with the foregoing method is illustrated in greater detail in FIGS. 24–26. Note that a common masking operation is used to define both a trace of the coil and a stratum of the core.

Considering the magnetics of the solenoid of FIG. 5, because the coil makes about 2½ turns about the core, the current required to switch magnetic states is less than that required in designs having only a single turn or, more difficult still, only a partial turn. The solenoid of FIG. 5, however, requires higher switching current than may be available in some designs.

Referring to FIG. 8, an exploded view of an alternative solenoid design is shown. FIG. 9 shows an isometric view of the solenoid. FIGS. 10 and 11A show rotated exploded and isometric views, respectively. As compared to the solenoid of FIG. 5, the solenoid of FIG. 8 has fewer turns—1¼ instead of 2½. However, the solenoid of FIG. 8 results in very little stray magnetic flux. The solenoid of FIG. 8 is further advantageous in that it allows multiple solenoids to be tightly packed together in interdigitated fashion. High density is, of course, a prime desideratum in any memory technology.

As with the solenoid of FIG. 5, the solenoid of FIG. 8 is formed in layers using conventional semiconductor processes. The solenoid of FIG. 8, however, exhibits a "metal-on-metal" layer structure—no vias are used. A substantially closed magnetic path is provided by magnetically coupling the uppermost trace of the coil to the core, either through a thin insulating layer if it is desirable to electrically insulate the coil from the post, or with a continuous connection as shown. FIG. 11B shows a plan view of the solenoid of FIG. 8 superimposed on a plan view of a magFET, indicated in dashed lines. The core of the solenoid is centered over the gate of the magFET. The outer edges of the coil of the solenoid may be approximately aligned with the center of the source and drain regions, respectively. In one magnetic state, for example, magnetic flux thus travels down through the core, the ferromagnetic gate and the underlying device channel, out around the gate, up through the coil, and back down through the core. The magnetizing current can be directed through just the coil or alternatively through the coil and post thereby using the post to assist the element switching. If the coil and post dimension are one micrometer or less the magnetic domains may act as a single domain which can be desirable in many designs.

In the example of FIG. 8, the solenoid is formed using six metal layers. In each of metal layers M1 through M5, a stratum of the core is formed, together with a ¼-plus-turn trace (the "plus" portion of each trace overlapping with a similar portion of one or more other traces). At each succeeding level, the ¼-turn trace is rotated (e.g., clockwise) ¼ turn with respect to the preceding trace. The five ¼-turn traces of metal layers M1 through M5 together therefore form 1¼ turns. If electrical isolation of the coil and post is desired, in the metal layer M6, there can be formed a "keeper" member which sits atop the core, separated from it by a thin insulating layer. The M5 trace provides electrical connectivity, allowing for connection to a common return path shared by adjoining interleaved solenoids, for example. The M1 trace provides separate electrical connectivity for each individual coil.

The various cooperating ferromagnetic structures described can be coupled to the ferromagnetic gate of the magFET of FIG. 1 or to a conventional magFET with two or more drains and one or more gates, including possibly a ferromagnetic gate. The various cooperating ferromagnetic structures described normally exhibit two different stable magnetic states. However it is possible to design the structures so that they can be operated on one or more major or minor hysteresis axes to provide multiple bits of storage per structure. Because of the efficiency of the structures, the switching current required to switch between the stable magnetic states is sufficiently small as to be sourced by a single, small-dimension MOS device. Furthermore, the various cooperating ferromagnetic structures described each cause a magnetic field to be established that is substantially orthogonal to the sense current that flows in the magFET, thereby maximizing carrier deflection and sensitivity of the magFET. These properties make the permanent magnetic structures ideally suited for use in magnetic integrated circuit memories as well as other fields of use.

Various elements of the previously described magnetic integrated circuit structures may be employed separate and apart from a current-deflection-type magnetic field sensor such as a magFET. In particular, the foregoing structures incorporate what may be regarded as various vertical magnetic field generators, where "vertical" is specified relative to a "horizontal" semiconductor substrate. Each of the foregoing magnetic integrated circuit structures will be considered in turn, particularly with respect to how the structure generates a vertical magnetic field, or a vector field which has a vertical component.

C-Clamp

As previously described, the magnetic memories of the 1950's and 60's used doughnut shaped (toroid) elements of ferromagnetic material for some or all coil cores. Wires were strung through the center of the core. Current was run in either one of the two possible directions through the wire so as to magnetize the core in a clockwise or counter-clockwise direction. The magnetic field in cores is confined within the core itself and there is little magnetic field available to affect other functions.

It is common in magnetic elements to introduce a gap into the structure. If a gap is small compared to the length of the ferromagnetic material, then the magnetic flux will continue through the gap and allow circuitry to be placed in the gap and hence be in the presence of the magnetic field. The gap can be air or other non-magnetic material, or a paramagnetic material such as silicon.

The C-Clamp magnetic integrated circuit structure of FIG. 1 is constructed of a ferromagnetic material. The MOS transistor is actually built into the magnetic gap of the C-Clamp. The gap is small because the C-Clamp also functions as the gate of the MOS transistor and is continued underneath the transistor structure.

A MOS transistor needs a metal to provide a work function in order to invert its channel. This work function can be provided by many different types of metals, and aluminum and polysilicon are usually used. There is no reason, however, why ferromagnetic metal such as nickel-iron cannot be used.

Using the C-Clamp structure as a gate permits the magnetic field to be directly orthogonal to the channel of the MOS device. A magnetic field down through the channel will cause some deflection to one of the two drains, and if the C-Clamp is magnetized in the opposite direction, magnetic flux up through the channel will cause some deflection to the opposite drain.

In order to initialize the C-Clamp to have a clockwise or counterclockwise current flow through its structure and gap, the two drains on the structure are used in conjunction with the C-Clamp electrically functioning as a MOS gate. In other words, the drain-gate-drain transistor is used as a wire through the core and the bi-directionality of the MOS device permits current to flow in one of two directions depending on which drain is at the higher potential. In order to write a current in the clockwise direction through element 110 of FIG. 1, for example, element 106 could be raised to 7 volts, element 105 could be grounded. In order to write the opposite direction, element 106 could be grounded and 105 could be tied to 7V. In both cases, it would be necessary to activate the gate 110 so that a channel is formed between source and drain.

Solenoid

The solenoid is a well-known element that produces a relatively constant magnetic field in its center. It is normally comprised of a group of tightly wound wires on a suitable spool much like sewing thread on a bobbin. In order to enhance the magnetic field, a ferromagnetic metal may be inserted into the center of the spool of wires or act as the bobbin.

It is also possible to use material which is electrically an insulator but still ferromagnetic (such as chromium dioxide) to provide self insulation of the coil and the port.

The magnetic field is concentrated by the core ferromagnetic element. The magnetic field is directed along the length of the rectangular element. Magnetic flux lines leave the top of the rectangular core and enter the bottom, or vice versa, depending on the polarity of the magnetic field.

FIGS. 5, 6, and 7, previously described, show a integrated circuit implementation of a solenoid. FIG. 7 shows the coil of wire where each turn is formed on a different layer in the vertical direction, and FIGS. 5 and 6 show the ferromagnetic core. It is implemented by making multiple horizontal partial loops, each on a different layer of the integrated circuit's metal wiring and having each vertical connection between loops implemented by a via hole which is filled with a conductor. Current flow from bottom to top will produce one direction of magnetization; current flow into the top input of the wire and out the bottom of the wire will produce the opposite direction.

The closed magnetic field lines leave the bottom of the ferromagnetic metal and, since the element is placed directly over the gate of the MOS device, the magnetic field is essentially orthogonal to its gate.

DNA or Interdigitated Solenoid

The so-called DNA structure shown in FIGS. 8 through 11B is a variation of the solenoid described above. The purpose of the DNA structure is to allow the permanent magnet structure to be built in reduced integrated circuit area. This is accomplished by having the coiled turns of one permanent magnet interleave and fit in between the coiled turns of its neighbor, thereby permitting multiple permanent magnets to share some common integrated circuit space, but maintain their magnetic and, if desired, also their electrical independence. Like the solenoid, the coil wraps around the ferromagnetic core. Unlike the solenoid, it is constructed of a group of letter "L" shaped pieces which fit one on top of the other in different integrated circuit layers. The structure shown in FIG. 10 functions like a 1¼ turn solenoid, whereas the solenoid of FIG. 7 comprises three turns.

Since the magnetomotive force which magnetizes a magnet is proportional to the number of turns, the DNA has reduced turns but reduced integrated circuit area requirements. The DNA, like the solenoid, produces a vertical magnetic field through its core or post element, which is dependent upon the direction of the magnetizing current through the coil. The ferromagnetics can be conductive or insulative depending on the choice of materials. Unlike, the solenoid, the DNA has useful variations.

Case 1. In the simplest case the post is isolated electrically and magnetically from the coil. It then functions like the solenoid earlier described with reduced area requirement and 1¼ turns versus three.

Case 2. In this instance, the coil is electrically insulated from the post by having the top piece, for example, be placed on a small thin layer of an insulator such as silicon dioxide, and then resting it on the post. This structure would be designed so that the insulation layer functions as a gap in the magnetic structure. This gap would be designed so that it is adequate to provide electrical insulation but thin enough to provide magnetic continuity. This feature is desirable when the decode scheme of circuitry such as a memory requires that the words lines be isolated from the permanent magnet storage function.

Case 3. It is also possible to have the post and the coil be a continuous piece of magnetic material. If the ferromagnetic metal is conductive, then electrical conductivity can be provided through the post and coil so that the coil and post function as a single electrical magnetic element. One can visualize, for example, the post and coil being stretched into one continuous element so as to form a rectangular bar magnet. In suitable geometries, for example sub-micron magnetics, it is possible that the structure will function as a single magnetic domain. The connections to the structure may be made in one of two ways. The coil can be contacted via a contact at the bottom of the coil and top of the coil or alternatively, two contacts can be made at the bottom of the structure, one to the coil and one to the post. In the latter case, putting current through a conductive ferromagnetic post will significantly reduce the amount of current required to switch the permanent magnetic structure. This is because the magnetizing force is proportionate to the distance from the magnetizing source. The post magnetizing current actually acts on the post itself, and is at a smaller distance than the magnetizing force of the coil acting on the post. The DNA permanent magnet is designed such that winding of the coil reinforces the magnetizing force of the post on the post itself in order to assist the switching action.

In a preferred embodiment, the foregoing cooperating ferromagnetic structures are made from PERMALLOY which is a nickel-iron mixture. The coercivity of the material is a measure of the stability of the structure and an indication of the amount of magnetizing current required to switch the structure. The structures are normally designed for 15 to 50 oersteds and a magnetic field across the channel of 50 to 300 gauss. The coercivity and the magnetic field are then significantly above the earth's magnetic field of about 0.5 gauss and 0.5 oersted and sufficiently stable to effect reliable nickel-iron can be adjusted by numerous methods including adding other compounds such as cobalt and by numerous manufacturing techniques including adjustment of the substrate temperature during film deposition. The magnetomotive force required to switch the structure is primarily a function of the gap length. A very small gap is desirable to allow small values of current to switch (write) the structure.

Single-Domain Post or Tube

This magnetic integrated circuit structure may be imagined as a microscopic vertically oriented bar magnet, sufficiently small to behave as a single magnetic domain. The coercivity of such a structure may be made adjustable by forming a non-ferrous cylinder and depositing around the cylinder a ferrous skin of a desired thickness. The relative masses of the non-ferrous core and the ferrous skin influence coercivity. The resulting tube has an elongated geometry. Because of the single domain nature of the tube and its elongated geometry, it can exist in only one of two stable magnetic states and requires that a destabilizing current be applied to switch between the two states. The field intensity obtained using such a magnetic tube may be much greater than that obtained using most other magnetic structures. This greater field intensity translates into a larger signal that may be more readily sensed. A greater field intensity also means faster operation.

Integrated circuit memories using the foregoing magnetic integrated circuit structures will now be described.

The foregoing magnetic integrated circuit structures may be used to advantage within existing magnetic semiconductor memory designs and magnetic field sensor designs, for example those of U.S. Pat. No. 5,068,826 (the Matthews patent) and U.S. Pat. No. 3,714,523 (the Bate patent), both of which are incorporated herein by reference. As applied to magnetic semiconductor memories, these designs, as originally conceived, suffer from the difficulties previously described (large write current, large cell size, stray magnetic coupling). The efficiency of a magnetic structure is directly related to the ratio of the length of flux paths in the core as compared to the length of the gap. The ratio should be as large as possible. In the foregoing magnetic integrated circuit structures, this ratio is large, an important factor in enabling the disadvantages of the prior art to be overcome.

Referring to FIG. 13A illustrating a prior-art memory cell in accordance with the Matthews patent, a Sensor portion 10 of the memory cell comprises a semiconductor Hall bar fabricated in a silicon substrate. A drive current, $I_d$, enters the Hall bar at p+ drain region 14 and exits the bar at p source region 15. The spaced-apart regions 14 and 15 define a channel 17 therebetween. The combination of regions 14, 15 channel 17 and an overlying polysilicon gate (not shown in FIG. 1) form an ordinary p-channel metal-oxide-semiconductor (MOS) device. The application of a low potential (e.g., 0 Volts) to the control electrode of a p-channel MOS device causes an inversion layer to be generated directly below the substrate surface in channel 17. This inversion layer provides a conductive path for the drive current $I_d$ to flow. In the particular implementation of FIG. 1, external voltage source 11 generates drive current $I_d$.

A pair of bipolar transistors are integrated into the Hall sensor as buffer amplifiers. These transistors are shown in FIG. 13A as transistors 28 and 29.

The base-emitter regions of NPN transistor 28 are indicted by regions 19 and 21, respectively, while the base-emitter regions for the NPN transistor 29 (located on the opposite side of the channel 17) are indicated by regions 18 and 22, respectively. The n-type substrate acts as a common collector for both transistors. As is described in the Matthews patent, the Hall voltage generated in the inversion layer of the MOS transistor becomes ohmically coupled to base regions 18 and 19. In this way, the voltage $V_{Hall}$ produces a difference potential across emitters 21 and 22, which is then detected by voltage sensor 12.

Referring to FIG. 13B, there is shown in cross-section a magnetic semiconductor memory cell like that shown in FIG. 3 of the Matthews patent but incorporating a solenoid 33, shown in outline, of one of the types previously described in relation to FIGS. 5 and 8. The illustrated cross-section corresponds to Section A–A' in FIG. 13A. Spaced-apart p+ regions 14 and 15 are shown fabricated in an n-type substrate 27. Regions 14 and 15 are fabricated using either ordinary diffusion or ion implantation techniques. A polysilicon gate 24 is formed directly above the channel 17. Gate 24 is insulated from substrate 27 by the gate oxide 26 below, and from magnetic patch 33 by a dielectric insulation layer 25 above. Ohmic contact to regions 14 and 15 is provided by members 37 and 38, respectively. In a BIMOS process, members 37 and 38 comprise doped polysilicon; however, ordinary metal, or other conductive materials, may also be used.

During normal read operations of the memory cell of FIG. 13B polysilicon gate number 24 is grounded to create a p+ inversion layer 35 in channel 17 of the sensor. Once inversion layer 35 has been formed, drive current may flow between source/drain regions 14 and 15. A voltage, $V_{Hall}$, is produced across layer 35 (directed either into or out of the page) in response to magnetic field 23.

In FIG. 13C a cross-sectional view of the magnetic memory cell of FIG. 13A is shown along cut lines B–B'. FIG. 13C illustrates how the bipolar junction transistors are integrated with the MOS Hall sensor. Basically, this is achieved by forming base regions 19 and 18 directly adjacent to the channel region 17 so that inversion layer 35 extends all the way to what normally is the base-collector junction of transistors 28 and 29.

In FIG. 13C, p-type region 19, n+ region 21 and n-type substrate 27 form NPN transistor 28. NPN transistor 29 is formed by substrate 27, p-type base region 18 and n+ emitter region 22. As discussed above, when current $I_d$ flows across inversion layer 35, a Hall voltage is developed across the transverse portion of channel 17. The p-type inversion layer 35 extends completely across channel 17 where it makes ohmic connection to each of the p-type bases 18 and 19. Thus, the voltage $V_{Hall}$ developed in inversion layer 35 is ohmically coupled to base regions 18 and 19 of transistors 29 and 28, respectively.

The solenoid 33 significantly increases the magnetic flux path length of the Matthews prior-art memory cell, thereby significantly increasing the magnetic efficiency of the cell and reducing the amount of current required to write information into the cell. The size of the cell may be correspondingly reduced. At the same time, the solenoid reduces stray magnetic flux and its influence on adjacent cells.

Referring to FIG. 14, there is shown a magnetic semiconductor memory cell using a magnetic field sensor like that shown in the Bate patent but incorporating a solenoid 33, shown in outline, of the type previously described in relation to FIG. 8. The memory cell of FIG. 14 offers the advantage that a small current imbalance may be sensed and a resulting voltage amplified to cause an output signal to undergo a rapid and pronounced voltage swing. More particularly, in the embodiment illustrated in FIG. 14, gates $G_1$ and $G_2$ and drains $D_1$ and $D_2$ are at the same potential, determined by the voltage source shown schematically at 34, when no magnetic field is present. It may be seen that this structure in essence defines two separate FET's, one device including $D_1$, $G_1$ and the source $S_1$ and the other device including $D_2$, $G_2$, and the source $S_1$. The gates of these two devices are formed sufficiently close to each other such that they interact in response to a magnetic field to produce an enhanced output signal as follows.

When a magnetic field is applied so that it is directed out of the sheet of the drawing, as schematically illustrated by the circled arrow tips at 36, holes in the inversion layer under $G_1$ are diverted from left to right to the inversion layer under $G_2$ by the force due to the combined effects of the electric field and the magnetic field. As a result, the drain current $I_{D2}$ increases while the current $I_{D1}$ decreases. The cross-connections of the drains $D_1$ and $D_2$ to gates $G_2$ and $G_1$, respectively, provides positive feedback which produces an enhanced output signal. Varying the external load resistance $R_L$ affects the sensitivity and stability of the FET magnetic field detector. As compared to other memory cells, the memory cell of FIG. 14 formed by combining a cooperating ferromagnetic member with the prior-art magnetic field sensor of Bate requires two separate control lines to control the potentials of the two separate gate portions. However, the sensor portion of the cell exhibits high sensitivity. The cooperating ferromagnetic member would be placed over the two gates and not be electrically or magnetically attached to the two gates.

Other novel and advantageous magnetic semiconductor memories using the foregoing magnetic integrated circuit structures will now be described.

Referring to FIG. 15, there is shown a two-word by two-bit (four-cell) storage cell array constructed using the magnetic integrated circuit structure of FIG. 1. Each storage cell has the same construction as described previously in relation to FIG. 1, i.e., each storage cell incorporates a magFET having a ferromagnetic gate and a cooperating ferromagnetic member that is magnetically coupled to the ferromagnetic gate to form a C-shaped magnet. Each cell requires connections to a word line, two data lines, and a ground line, or reference potential line. The ground line may be shared by all cells adjacent to it. Layout efficiency is therefore achieved by having different halves of the 2×2 array mirror one another about a line of symmetry. The sources of all the cells are then connected in common to a single ground line. Two opposing cells directly opposite one another across the line of symmetry may share a single source, furthering compactness. In the illustrated embodiment, one source S1 is shared by cells 1500 and 1510, and another source S1 is shared by cells 1501 and 1511. Alternatively, the cells may each have separate sources, which may be desirable in certain types of decoder schemes.

Data lines run "across" memory words, and select lines run "along" memory words. The select line connects in common to the gates of different cells within a single memory word. Hence, the gates 00G and 01G of cells 1500 and 1501 are joined by a R/W0 select line SEL0. The gates 10G and 11G of cells 1510 and 1511 are joined by a R/W1 select line SEL1. In the opposite direction, one line D0 of a differential data line pair (DATA 0) connects corresponding ones (e.g., drains 02D1 and 11D1) of the two drains of respective cells 1500 and 1510, and the other line D0b of the same differential data line pair connects corresponding other ones of the drains of the same cells (e.g., drains 01D2 and 11D2). Similarly, one line D1 of the differential data line pair (DATA 1) connects drains 00D1 and 10D1, and the other line D1b of the same pair connects drains 00D2 and 10D2.

Assume that each individual gate is magnetically polarized so as to produce in a corresponding respective channel region a vertical magnetic field in either the upward direction or the downward direction. In order to read information stored in Word 0, the select line S0 is driven to a level of, say, 2V, sufficient to cause the respective magFETs of cells 1500 and 1501 to conduct. The differential line pairs are coupled to respective sense amplifiers. Through the current deflection mechanism previously described, the respective magFETs will sense the polarities of the magnetic fields stored within the respective magnets of cells 1500 and 1501, causing these polarities to be reflected in the voltage polarities carried on the respective differential line pairs.

In some designs, it may be desirable to hold the voltage in the drains during the READ operation at approximately same voltages to maximize the signal and avoid parasitic transistor action among the drains or to keep the drains at a relatively high voltage to cause significant electric field across the source-drain region. These objectives can be accomplished, as shown in FIG. 27, by simply adding a buffer circuit in a cascade configuration that translates the current difference in the drains into a subsequent voltage. For example the emitter of bipolar transistor or the source of other MOS device could be tied to the drains while having the base or gate held at constant potential. A current difference in the magFET drains will now show in collector or drain variations while substantially maintaining selectively high or stable voltages in the magFET.

In order to write a data bit into a cell, a magnetizing current must be passed "through the mouth of the C", in one direction to store a logic 0 and the opposite direction to store a logic 1. To write a data bit, the two drains of a cell function as a transistor to pass current in one of two possible directions from one drain to the other. The direction of the lines of flux and the consequent polarity of the magnetic field produced reverse according to the direction and carrier polarity of the magnetizing current. Given a C-shaped magnet having the same orientation as the letter C on a page, a current in the direction into the page produces flux lines in a clockwise counter-clockwise direction depending on whether the carriers are holes or electrons. The upper "jaw" or polepiece of the C-shaped magnet is therefore magnetized as a North pole and the lower polepiece is magnetized as a South pole. A current in the direction out of the page produces the opposite magnetization.

In some designs, the required magnetizing current may be substantial, 3 mA for example. A small-size MOS device of suitable width to length ratio is able to provide such a current if the gate voltage of the device is raised to a sufficiently high voltage, e.g., 7V. Therefore, to write information into a memory word, the select line for that word is raised to what would typically be a higher-than-normal voltage level. Differential voltages of the appropriate polarities are placed on the differential line pairs, causing the magnets of the respective cells to be magnetized with corresponding polarities to therefore represent logic 0s and logic 1s as desired.

The 2×2 storage cell array of FIG. 15 is shown in plan view in FIG. 16. Cross-section views indicated in FIG. 16 are shown in FIG. 17 and FIG. 18, respectively. FIG. 16, FIG. 17 and FIG. 18 correspond in large measure to FIG. 2, FIG. 3 and FIG. 4 previously described and will therefore not be further described.

In the case of the memory cells of FIG. 15, the cooperating ferromagnetic member of each cell underlies the ferromagnetic gate and together with the ferromagnetic gate forms a C-shaped magnet. In place of such a cooperating ferromagnetic member, other cooperating ferromagnetic members may be used as previously described. Referring to FIG. 19, there is shown a two-word by two-bit (four-cell) storage cell array using as the cooperating ferromagnetic member the solenoid of FIG. 5. Within each cell, a solenoid like that of FIG. 5 is formed on top of and magnetically coupled to the gate of the magFET.

As compared to the storage cell array of FIG. 15, in the storage cell array of FIG. 19, three data lines are provided for each cell. The differential lines, D0 and D0b for example, function in like manner as in the storage cell array of FIG. 15. The third data line, D0W, for example, is pulled high or low during a write operation depending on the logical value to be written, thereby determining the direction of current through the solenoid. The source is not grounded as in the previous embodiment, nor does write current flow from drain to drain as in the previous embodiment. Instead, write current flows from drain to source through a coil of the solenoid.

As in the case of the storage cell array of FIG. 15, in the storage cell array of FIG. 19, two opposing cells directly opposite one another across the line of symmetry may share a single source as shown in FIG. 19, furthering compactness. Alternatively, the cells may each have separate sources.

An equivalent circuit of the memory cell of FIG. 19 is shown in FIG. 20. The source of a magFET 2001 is coupled to the coil of a solenoid 2003 of one of the types shown in FIG. 5 and FIG. 8. The other end of the coil is coupled to a data write line D0W. The data write line may be grounded or raised to a logic high (e.g., 5v) through a switch 2005. The drains $D_1$ and $D_2$ of the magFET are coupled to differential data lines D0 and D0b, respectively. The differential data lines may be grounded, raised to a logic high, or floated by means of ganged switches 2007A and 2007B, respectively. The differential data lines are also coupled to a differential amplifier (not shown). The gate of the magFET may be grounded to deselect a decoded row, raised to a relatively low voltage level (e.g., 2v) to read, or raised to a high voltage level (e.g., 7v) to write.

In operation, in order to write a data bit to the memory cell, magnetizing current is caused to flow in one of two possible directions through the coil of the solenoid and through the magFET. For example, to write a logic high value to the memory cell, the switch 2009 is switched to the uppermost position so as to apply 7V to the gate of the assumed n-Channel magFET shown. At the same time, the switches 2007A and 2007B are switched to the uppermost position so as to apply 5V to the drains $D_1$ and $D_2$, and the switch 2005 is grounded. A current $I_{"1"}$ is therefore caused to flow right to left through the coil or the coil and port of the solenoid. To write a logic low value, the switches 2005, on the one hand, and 2007A and 2007B, on the other hand, are placed in opposite positions. That is, the switches 2007A and 2007B are grounded, and the switch 2005 is raised to 5V. A current $I_{"0"}$ is therefore caused to flow right to left through the coil of the solenoid.

It is also possible to avoid the "read disturb" of having some read current go through the coil or alternatively have the gate voltage for the read and write be the same by adding an additional selection wire which contacts the source "S".

The read operation is typically performed by putting switch 2009 in the 2V position and by putting switches 2007A and 2007B in the FLOAT position and switch 2005 in the grounded position. MagFET 2001 is as a result biased ON and approximately equal drain current will flow through from +V into R+ and R− if there is no magnetic field. A magnetic field orthogonal to the gate of 2001 will cause either more or less current to flow through R+ and R− depending on the direction of the magnetic field. The current difference is then sent to the differential amplifier for sensing. The amount of current sent through element 2003 during read, the "read disturb current" is significantly below what is required to switch it if the read operation is designed to be a nondestructive read out. The "read disturb" is typically held to less than 30% of the write current to provide a safety margin by having a lower gate voltage during read than during write.

Prior art magnetic memory elements pose considerable difficulty in switching between states and in reliably sensing the difference between states. Switching between states has required considerable current. As a result, cycle time is prolonged. Distinguishing between states has required very sensitive circuitry because of the very small signal strength produced by a typical magnetic memory element.

The foregoing difficulties may be overcome by using as the magnetic memory element a magnetic post or tube of sufficiently small dimensions as to constitute a single magnetic domain.

Today's semiconductor lithography is at 0.25 micron minimum dimension and heading rapidly for 0.1 micron. Magnetic structures produced using state-of-the-art lithography can now, for the first time, be single domain, enabling enhanced sense signals and increased competitiveness, to the magnetic semiconductor memory. Other technologies such as ferroelectric and DRAM capacitors do not scale well to smaller dimensions, and they may face a physical limit, since their basic unit cell at the atomic level requires more atoms. Magnetic devices appear to get better as they get smaller, providing a viable path to deep sub-micron size memories.

Magnetic permanent structures are defined herein as those having a size roughly 1 micron or larger. The remanent magnetic field of macromagnetic structures, after the magnetizing current is removed, is determined by the so-called magnetic B-H characteristics, and by the ratio of the length of the magnetic structure to the length of the non-magnetic portion or gap. The smaller the gap the stronger the remaining field. The relationship is linear. A so-called load-line is usually drawn on the second quadrant of the B-H curve to predict the static permanent magnet's field once the magnetizing current is removed.

For example, in a horseshoe shaped magnet, the B-H loop might produce a B of 10,000 gauss when the magnetizing current H is maximum. The remanent field with no magnetizing current and no gap might be 7500 gauss. If the gap is one tenth the length of the structure, the field would be about 750 gauss in the gap In a micromagnetic structure having a size less than a value roughly between 0.5 and 1.0 microns, the macromagnetic rule needs to be modified. The statistical switching or partial switching of a group of domains is what causes the curves in the B-H plots. As size gets below 1 micron and the size of the structure starts to approach the size of a domain, the structure starts to "have room" for just a single domain and not have room for multiple domains. The B-H plot consists of only singular points, and load-line analysis doesn't apply.

The magnetic field, as in the macromagnetic case, falls off as the gap gets longer and is dictated by magnetostatics, but the remanence value appears to remain at 7500 gauss, not the 750 gauss above.

This behavior makes intuitive sense, in view of tremendous binding forces at the atomic level holding atoms together as evidenced by atomic bombs releasing this energy. As structures get smaller, the first signs of these increases may be observed, marking the boundary of micromagnetics and the single domain region.

A greatly enlarged view of a single domain magnetic memory element is shown in FIG. 27. The magnetic memory element is formed on a substrate having a magFET formed therein, the magFET including (as described in relation to previous embodiments) a source (mostly obscured in the view of FIG. 27), dual drains, a gate oxide layer and a (non-ferrous) gate electrode. Drain wires are joined to respective drain regions by contacts. A source contact is shaped so as to form above the gate a platform on which is formed a non-ferrous post having a ferromagnetic (e.g., NiFe) skin. To the top of the post is joined a source wire. A pair of orienting wires run alongside the post on either side, preferably about mid-way up the post. Current is driven through the orienting wires, always in opposite directions, such that the orienting wires form a pseudo turn with both ends of the wires meeting, hypothetically, at a distance of infinity. (In some embodiments, the orienting wires may actually form a physical loop.) The manner in which information is written to and read from such a magnetic memory element is described hereafter.

A 2×2 array of magnetic post memory elements is shown in FIG. 28. In a large array of such memory elements, sharing of structures between neighboring elements is possible as described in relation to the preceding embodiments.

FIG. 29 is a list of process flow steps for forming a magnetic memory element like that of FIG. 27. The illustrated process is exemplary only and sets forth numerous details not necessary to practice of the invention.

In steps 1–6, the cantilevered pedestal on which the post sits is formed. The vertical portion of the formed first, followed by the horizontal portion. In steps 6–9, the non-ferrous post is formed by plating. Because of lithography limitations, the post is initially oversized. In step 10, the post is etched down to a smaller size are required for single-domain magnetic behavior. The post is then plated with NiFe or other suitable magnetic material (step 11). During step 13, a thick insulating layer surrounding the post is formed of a suitable insulating material, e.g., SOG, polyimide, etc. The insulator is then patterned to make contact to the top of the post. The NiFe is removed from the top of the post for this purpose. The remaining steps in the fabrication sequence are largely conventional.

The coercivity of the magnetic tube structure may be adjusted by adjusting the thickness of the magnetic skin. As a result, the magnetic memory element is readily scalable to smaller geometries as lithographic techniques improve. Were the post formed entirely of magnetic material, the coercivity of the resulting structure would likely be too great to allow it to be switched.

The combination of very small, single-domain size and a relatively large aspect ratio results in uniquely desirable properties. Current levels within any reasonable expectation operate to switch the state of the magnetic tube only when the magnetic tube is destabilized by running current through it. With current flowing through the magnetic tube, its state may be readily changed by running modest current levels through the orienting wires. When the magnetic tube is switched, the single domain nature of the magnetic tube produces a signal that is typically 5–15 times stronger than signals produced by conventional magnetic memory elements.

To write information to a magnetic memory element like that of FIG. 27, the gate line is activated and a destabilizing flow of current is driven down the post and through the underlying magFET, from the source to the drains. As a result, the magnetic post enters a meta-stable magnetic state which, when the destabilizing flow of current is removed, will revert to one of two stable magnetic states. In these two stable magnetic states, the magnetic post functions as a vertical magnetic field generator, in one of the states generating a magnetic flux downward through the gate of the magFET and in the other of the states generating a magnetic flux upward through the gate of the magFET. A real-world analogy is helpful in understanding operation of the magnetic post. Hold a pencil vertically on the table resting on its point. This is the magnetic equivalent of destabilizing it. Which way it falls to a particular stable state (left or right or front or back) is a function of the wind, initial alignment, etc. To make the pencil fall a particular way a slight additional force or wind (analogous to the orienting wire current) can be used once the pencil weight (analogous to the coercivity) has been negated by the vertical position (which is analogous to the destabilizing current.)

By way of additional comparisons, in another magnetic storage technology, the media is heated via lasers to the Curie temperature where it loses magnetism and is then allowed to cool in the presence of an orienting field. Basically the coercivity is knocked out of the material by heating it and then it is oriented as desired. The described destabilizing current is analogous to the heating since it puts a circular magnetic field around the post (when viewed from the top), yet post geometry dictates an up/down or down/up stable state with no external destabilization, thus the field must fall from circular to vertical. Absent the orienting wires, the magnetic post would revert to one of the two stable magnetic states in an uncontrolled manner. The final state might, for example, be determined by many different stray magnetic fields and disturbances such as the Earth's magnetic field, state of the neighbors, etc. The orienting wires allow the magnetic post to be influenced to transition to a desired one of the two stable magnetic states. Before the destabilizing flow of current has ceased and state transition has begun, an orienting current is driven in one direction or the other through the pseudo loop; i.e., assuming that the orienting wires run in a horizontal direction, either current is driven to the right in a first orienting wire and to the left in the other orienting wire, or current is driven to the left in a first orienting wire and to the right in the other orienting wire. In this manner, either a logic 1 or a logic 0 may be written.

Information is read from the magnetic post memory element in the same manner as described in relation to the preceding embodiments. The read current that flows through the magnetic post is less than a threshold destabilizing value such that read-out is non-destructive.

Unlike previous embodiments, in the present embodiment, current flow through the magFET is required in only one direction. Referring to FIG. 30 therefore, an equivalent circuit diagram of the magnetic post memory element and associated circuitry differs from the circuit of FIG. 20 in part in that the drain lines and the source line are switched to only a single source of potential. (The destabilizing current functions to form circular fields—it doesn't matter which direction of rotation the circular fields have. Unlike FIG. 20, in FIG. 30, orienting wires are provided to set the direction—up/down or down/up—of the magnetic field in the steady-state condition.) Furthermore, the arrangement of the "solenoid" is completely changed. Instead of current flowing through the coil of the solenoid as in FIG. 20, current flow through the core of the solenoid. Current is separately driven through the coil (pseudo coil, or orienting wires) in either of two directions.

It will be appreciated by those of ordinary skill in the art that the present invention may be embodied in other specific forms without departing from the spirit or essential character thereof. The foregoing description is therefore considered in all respects to be illustrative and not restrictive. The scope of the invention is indicated by the appended claims rather than the foregoing description, and all changes that come within the meaning and range of equivalents thereof are intended to be embraced therein.

What is claimed is:

1. An adjustable coercivity magnetic memory element comprising:

an elongated non-ferrous member;

a ferrous skin formed about said non-ferrous member, wherein adjustment of respective masses of the non-ferrous member and the ferrous skin results in adjustment of the coercivity of the magnetic memory element; and a magFET magnetic field sensor formed in intimate proximity to said member.

2. An adjustable coercivity magnetic memory element comprising:

an elongated non-ferrous member;

a ferrous skin formed about said non-ferrous member, wherein adjustment of the thickness of the ferrous skin results in adjustment of the coercivity of the magnetic memory element; and a magFET magnetic field sensor formed in intimate proximity to said member.

3. The magnetic memory element of claim 2 wherein said magnetic memory element has an aspect ratio of at least approximately 2:1.

4. The magnetic memory element of claim 2 wherein a minimum dimension of said magnetic memory element is no more than approximately 0.8 microns.

5. The magnetic memory element of claim 1 wherein said magnetic memory element has an aspect ratio of at least approximately 2:1.

6. The magnetic memory element of claim 1 wherein a minimum dimension of said magnetic memory element is no more than approximately 0.8 microns.

* * * * *